(12) United States Patent
Nagai et al.

(10) Patent No.: US 10,676,838 B2
(45) Date of Patent: Jun. 9, 2020

(54) PLATING DEVICE, PLATING METHOD, SUBSTRATE HOLDER, RESISTANCE MEASURING MODULE, AND SUBSTRATE HOLDER TESTING METHOD

(71) Applicant: EBARA CORPORATION, Tokyo (JP)

(72) Inventors: Mizuki Nagai, Tokyo (JP); Kazuhito Tsuji, Tokyo (JP); Takashi Kishi, Tokyo (JP); Toshiki Miyakawa, Tokyo (JP); Masashi Shimoyama, Tokyo (JP); Jumpei Fujikata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 122 days.

(21) Appl. No.: 15/878,267

(22) Filed: Jan. 23, 2018

(65) Prior Publication Data

US 2018/0209062 A1 Jul. 26, 2018

(30) Foreign Application Priority Data

Jan. 24, 2017 (JP) .................. 2017-010459
Mar. 7, 2017 (JP) .................. 2017-042643

(51) Int. Cl.
*C25D 17/08* (2006.01)
*H01L 21/687* (2006.01)
*C25D 21/12* (2006.01)
*C25D 17/00* (2006.01)
(Continued)

(52) U.S. Cl.
CPC .......... *C25D 17/08* (2013.01); *C25D 17/001* (2013.01); *C25D 17/005* (2013.01); *C25D 17/06* (2013.01); *C25D 21/12* (2013.01); *H01L 21/6723* (2013.01); *H01L 21/68785* (2013.01); *C25D 17/00* (2013.01); *C25D 17/004* (2013.01)

(58) Field of Classification Search
CPC ........ C25D 21/12; C25D 17/08; C25D 17/06; C25D 17/001; C25D 17/005; C25D 17/007

See application file for complete search history.

(56) References Cited

U.S. PATENT DOCUMENTS 6,755,946 B1 * 6/2004 Patton .................. C25D 17/06
204/224 R
2005/0083048 A1 * 4/2005 Lei ........................ C25D 17/00
324/229

(Continued)

FOREIGN PATENT DOCUMENTS

JP 2005-146399 A 6/2005
JP 2015-200017 A 11/2015

*Primary Examiner* — Nicholas A Smith
(74) *Attorney, Agent, or Firm* — BakerHostetler

(57) ABSTRACT

A resistance measuring module for measuring electric resistance of a substrate holder is provided. The substrate holder has an electric contact configured to feed a current to a held substrate and contactable with the substrate. The substrate holder is able to hold a testing substrate for measurement of electric resistance of the substrate holder, and is configured such that the electric contact comes into contact with the testing substrate in a state where the testing substrate is held. The resistance measuring module includes: a test probe contactable with the testing substrate held in the substrate holder; and a resistance measuring instrument for measurement of a resistance value between the electric contact and the probe via the testing substrate.

15 Claims, 34 Drawing Sheets

(51) Int. Cl.
 *H01L 21/67* (2006.01)
 *C25D 17/06* (2006.01)

(56) References Cited

U.S. PATENT DOCUMENTS

| | | | | |
|---|---|---|---|---|
| 2005/0110512 A1* | 5/2005 | Berman | ............... | C25D 21/12 |
| | | | | 324/756.07 |
| 2005/0282371 A1* | 12/2005 | Patton | ................. | C25D 3/38 |
| | | | | 438/597 |
| 2014/0367265 A1* | 12/2014 | Ravid | ................. | G01B 7/105 |
| | | | | 205/83 |
| 2015/0276835 A1 | 10/2015 | Minami | | |

\* cited by examiner

PLATING DEVICE, PLATING METHOD, SUBSTRATE HOLDER, RESISTANCE MEASURING MODULE, AND SUBSTRATE HOLDER TESTING METHOD

TECHNICAL FIELD

The present invention relates to a plating device, a plating method, a substrate holder, a resistance measuring module, and a substrate holder testing method.

BACKGROUND ART

There is known a plating device in which a substrate of a semiconductor wafer or the like is held in a substrate holder and the substrate is immersed into a plating solution in a plating tank. As shown in FIG. 18, the substrate holder includes a plurality of internal contacts 100 that come into contact with the circumferential edge of a substrate W, and a plurality of external contacts 101 respectively connected to the internal contacts 100. Wires 104 connecting between the plurality of internal contacts 100 and the plurality of external contacts 101 are disposed inside the substrate holder. The external contact 101 is brought into contact with a power feed terminal 103 connected to a power source 105 when the substrate holder is disposed in a predetermined position in the plating tank. A current flows to the substrate W through the external contact 101 and the internal contact 100, and a metal film is formed on the surface of the substrate W in the presence of the plating solution.

When electric resistance between a certain internal contact 100 and the substrate W (hereinafter simply referred to as electric resistance of the internal contact 100) is extremely high or extremely low, currents flowing in the plurality of internal contacts 100 become non-uniform, which may cause a problem with the uniformity of the film thickness within the substrate surface. There have thus been techniques in which a value of resistance against a current, flowing from the internal contact of the substrate holder to the substrate being a plating object, is measured in a state where the substrate is held in the substrate holder, to test the substrate and the substrate holder (for example, Japanese Patent Laid-Open No. 2015-200017 and Japanese Patent Laid-Open No. 2005-146399).

CITATION LIST

PTL 1: Japanese Patent Laid-Open No. 2015-200017
PTL 2: Japanese Patent Laid-Open No. 2005-146399

SUMMARY OF INVENTION

Technical Problem

In Japanese Patent Laid-Open No. 2015-200017, in a state where the substrate being a plating object is held in the substrate holder, electric resistance against a current is measured, the current flowing from one electric contact of the substrate holder to another electric contact thereof through the substrate. The substrate or the substrate holder is determined as normal when the electric resistance is within a permissible range, and determined as abnormal when the electric resistance is out of the permissible range. There are mainly two causes of the abnormality of the electric resistance. One cause is a factor on the substrate side. For example, the abnormality of the electric resistance can occur in such a case where electric conduction layers (seed layers) are not uniformly formed on the surface of the substrate, a case where an unnecessary object, which is produced at the time of application of resist to the substrate, remains on the substrate, or a case where the surface of the substrate has been oxidized. The other cause is a factor on the substrate holder side. The abnormality of the electric resistance can occur in such a case where the internal contact of the substrate holder has been deformed, a case where a foreign matter such as resist has adhered to the internal contact of the substrate holder, or a case where the plating solution has adhered to the internal contact of the substrate holder. However, when the abnormality occurs in the electric resistance, it is not possible, by the method disclosed in Japanese Patent Laid-Open No. 2015-200017, to determine whether the abnormality is caused by the substrate or the substrate holder. For example, when the substrate holder is abnormal and the substrate itself is not abnormal, normal plating treatment can be performed by replacing the substrate holder. When the substrate is abnormal and the substrate holder itself is not abnormal, normal plating treatment can be performed by replacing the substrate. However, making such a determination requires clarification of whether the cause of abnormality of the electric resistance lies on the substrate side or the substrate holder side. Accordingly, one object of the present application is to be capable of detecting abnormality of electric resistance caused by a factor having occurred in a substrate holder. Another object of the present application is to be capable of detecting abnormality of electric resistance caused by a factor having occurred in a substrate.

Solution to Problem

[First Aspect]
According to a first aspect, a resistance measuring module for measuring electric resistance of a substrate holder is provided. The substrate holder has an electric contact configured to feed a current to a held substrate and contactable with the substrate. The substrate holder is able to hold a testing substrate for measurement of electric resistance of the substrate holder, and is configured such that the electric contact comes into contact with the testing substrate in a state where the testing substrate is held. The resistance measuring module includes: a test probe contactable with the testing substrate held in the substrate holder; and a resistance measuring instrument for measurement of a resistance value between the electric contact and the probe via the testing substrate. According to the resistance measuring module of the first aspect, it is possible to measure the electric resistance of the substrate holder and detect the abnormality of the electric contact in the substrate holder or an electric path.

[Second Aspect]
According to a second aspect, the resistance measuring module of the first aspect includes a testing substrate having a plurality of electrically insulating regions.

[Third Aspect]
According to a third aspect, in the resistance measuring module of the second aspect, the resistance measuring instrument is configured such that the test probe is contactable with each of the plurality of regions of the testing substrate.

[Fourth Aspect]
According to a fourth aspect, in the resistance measuring module of the third aspect, the test probe of the resistance measuring instrument is configured so as to be movable in an in-plane direction of the testing substrate.

[Fifth Aspect]

According to a fifth aspect, in the resistance measuring module of the third aspect, the resistance measuring instrument includes a support member, the test probe is attached to the support member, and the support member is configured so as to be rotatable around a shaft vertical to the plane of the testing substrate.

[Sixth Aspect]

According to a sixth aspect, in the resistance measuring module of any one of the third to fifth aspect, the resistance measuring instrument includes a plurality of test probes, and the plurality of test probes are configured so as to be respectively contactable with the plurality of regions of the testing substrate.

[Seventh Aspect]

According to a seventh aspect, a substrate holder is provided, and the substrate holder includes: a substrate support portion for supporting a substrate; an electric contact, configured to feed a current to the held substrate and contactable with the substrate; and an electric conduction plate disposed on the substrate support portion. The electric contact and the electric conduction plate are configured so as to be contactable with each other in the state of the substrate holder holding no substrate. According to the seventh aspect, it is possible to measure the electric resistance of the substrate holder and detect the abnormality of the electric contact in the substrate holder or the electric path. Further, it is possible to detect the abnormality of the electric contact in the substrate holder or the electric path without using the testing substrate.

[Eighth Aspect]

According to an eighth aspect, the substrate holder of the seventh aspect includes: a plurality of electric contacts, configured to feed a current to the held substrate and contactable with the substrate; and a plurality of electric conduction plates disposed on the substrate support portion. The plurality of electric contacts and the plurality of electric conduction plates are configured so as to be contactable with each other, respectively, in the state of the substrate holder holding no substrate.

[Ninth Aspect]

According to a ninth aspect, a substrate holder testing method is provided, and the method includes the steps of: holding a testing substrate into a substrate holder; bringing an electric contact into contact with the testing substrate, the electric contact being configured to feed a current to the substrate held in the substrate holder and contactable with the substrate; bringing a test probe into contact with the testing substrate; and measuring a resistance value between the electric contact and the probe via the testing substrate. According to the method of the ninth aspect, it is possible to measure the electric resistance of the substrate holder and detect the abnormality of the electric contact in the substrate holder or the electric path.

[Tenth Aspect]

According to a tenth aspect, the method of the ninth aspect includes a step of determining whether the substrate holder is usable based on the measured resistance value.

[Eleventh Aspect]

According to an eleventh aspect, a substrate holder testing method is provided, and in the method, the substrate holder includes a substrate support portion for supporting a substrate, an electric contact, configured to feed a current to the held substrate and contactable with the substrate, and an electric conduction plate disposed on the substrate support portion. The electric contact and the electric conduction plate are configured so as to be contactable with each other in the state of the substrate holder holding no substrate. The method includes the steps of: bringing the electric contact and the electric conduction plate into contact with each other; bringing a test probe into contact with the electric conduction plate; and measuring a resistance value between the electric contact and the test probe via the electric conduction plate. According to the eleventh aspect, it is possible to measure the electric resistance of the substrate holder and detect the abnormality of the electric contact in the substrate holder or the electric path. Further, it is possible to detect the abnormality of the electric contact in the substrate holder or the electric path without using the testing substrate.

[Twelfth Aspect]

According to a twelfth aspect, the method according to the eleventh aspect includes a step of determining whether the substrate holder is usable based on the measured resistance value.

[Thirteenth Aspect]

According to a thirteenth aspect, a plating treatment method is provided, and the method includes the steps of: preparing a substrate holder that includes a plurality of electric contacts contactable with a substrate to be a held plating object, a conductive member having the same number of electric conduction regions, electrically insulated from each other, as the number of the plurality of electric contacts, and a resistance measuring module including a probe; bringing the plurality of electric contacts into contact respectively with the plurality of electric conduction regions in the state of the substrate holder holding no substrate that is the plating object; bringing the probe into contact with each of the plurality of electric conduction regions to measure a resistance value of a current flowing between the electric contact and the probe; determining whether the substrate holder is usable based on the measured resistance value; holding the substrate to be the plating object into the substrate holder determined as usable; and immersing the substrate holder holding the substrate that is the plating object into the plating solution to perform electroplating. According to the method of the thirteenth aspect, it is possible to measure the electric resistance of the substrate holder and detect the abnormality of the electric contact in the substrate holder or the electric path. The conductive member may be the testing substrate or the electric conduction plate provided in the substrate holder.

[Fourteenth Aspect]

According to a fourteenth aspect, there is provided a computer-readable recording medium in which a program is recorded, the program causing a control device for controlling operation of a plating treatment device to control the plating treatment device when the program is executed by the control device, so as to execute the plating treatment method according to the thirteenth aspect. The recording medium can be a freely selected medium and can, for example, be a nonvolatile recording medium such as a CD, a DVD, a hard disk, or a flash memory.

[Fifteenth Aspect]

According to a fifteenth aspect, there is provided a program that causes the control device including a computer to perform the method according to the thirteenth aspect.

[Sixteenth Aspect]

According to a sixteenth aspect, a maintenance method for a plating treatment device is provided, and the method includes the steps of switching a plating device to a maintenance mode for testing a substrate holder; performing the following procedures (1) to (4): (1) disposing the substrate holder in a resistance measuring module and measuring electric resistance of the substrate holder, (2) transferring the measured electric resistance to a control device and performing a test for determining whether the measured electric resistance of the substrate holder is within a predetermined region in the control device, (3) disposing the tested substrate holder in a stocker, and (4) continuing the above processes of (1) to (3) until the test on untested substrate holders in the plating device is completed; and conducting maintenance the substrate holder with the electric resistance determined not to be within the predetermined region in the test. According to the maintenance method of the sixteenth aspect, it is possible to test all the substrate holders used in the plating treatment device.

[Seventeenth Aspect]

According to a seventeenth aspect, a plating device is provided, and the plating device includes: a resistance measuring instrument that measures electric resistance of an electric conduction layer on an edge portion of a substrate being a plating object; and a substrate holder for holding the substrate. The resistance measuring instrument is configured so as to measure electric resistance of the substrate before the substrate is held by the substrate holder. According to the plating device of the seventeenth aspect, it is possible to find a detect of the substrate by measuring the electric resistance of the electric conduction layer on the edge portion of the substrate immediately before the start of the plating treatment. With the lapse of time, an oxide film may be formed on, or an organic matter volatilized from resist may adhere to, the electric conduction layer on the edge portion of the substrate. Therefore, by determining the state of the substrate immediately before the start of the plating treatment, favorable plating treatment can be performed.

[Eighteenth Aspect]

According to an eighteenth aspect, in the plating device of the seventeenth aspect, the resistance measuring instrument is configured so as to measure electric resistance of each of a plurality of spots of the electric conduction layer on the edge portion of the substrate.

[Nineteenth Aspect]

According to a nineteenth aspect, in the plating device of the seventeenth or eighteenth aspect, the resistance measuring instrument includes a contact pin configured so as to come into contact with the electric conduction layer on the edge portion of the substrate.

[Twentieth Aspect]

According to a twentieth aspect, in the plating device of the nineteenth aspect, the contact pin is configured so as to be movable in a circumferential direction of the substrate. According to the twentieth aspect, the substrate is not moved or rotated, and the contact pin is moved to enable measurement of the electric resistance of the plurality of regions on the edge portion of the substrate.

[Twenty-first Aspect]

According to a twenty-first aspect, the plating device of any one of the seventeenth to twentieth aspects further includes an aligner for aligning an orientation of the substrate with a predetermined direction. The resistance measuring instrument is configured so as to measure electric resistance of the substrate disposed in the aligner. According to the twenty-first aspect, it is possible to measure the electric resistance of each of the plurality of regions of the substrate by using a rotation mechanism of the aligner. With no need for a place dedicated for measurement of the electric resistance of the substrate, it is possible to prevent the installation area of the plating device from increasing.

[Twenty-second Aspect]

According to a twenty-second aspect, the plating device of any one of the seventeenth to twentieth aspects further includes a fixing unit for fixing the substrate to the substrate holder. The resistance measuring instrument is configured so as to measure electric resistance of the substrate disposed in the fixing unit. According to the twenty-second aspect, with no need for a place dedicated for measurement of the electric resistance of the substrate, it is possible to prevent the installation area of the plating device from increasing.

[Twenty-third Aspect]

According to a twenty-third aspect, the plating device of any one of the seventeenth to twenty-second aspects further includes a control device that receives a resistance value measured using the resistance measuring instrument. The control device is configured so as to determine a state of the substrate based on the received resistance value. According to the twenty-third aspect, the failure or non-failure of the substrate can be automatically determined by the control device.

[Twenty-fourth Aspect]

According to a twenty-fourth aspect, the plating device of any one of the seventeenth to twenty-third aspects further includes an edge portion cleaning device for cleaning an edge portion of the substrate. According to the twenty-fourth aspect, by cleaning the edge portion of the substrate which has been determined as defective based on the measured value of the electric resistance on the edge portion of the substrate, an oxide film formed on, and a foreign matter adhering to, the edge portion of the substrate can be removed to bring the substrate into the favorable state.

[Twenty-fifth Aspect]

According to a twenty-fifth aspect, there is provided a computer program for causing a plating device, which includes a resistance measuring instrument that measures electric resistance of an electric conduction layer on an edge portion of a substrate being a plating object, a substrate holder for holding the substrate, and a control device including a computer, to execute the steps of: measuring the electric resistance of the electric conduction layer on the edge portion of the substrate as the plating object before the substrate is held by the substrate holder; and determining a state of the substrate based on the measured electric resistance of the substrate.

[Twenty-sixth Aspect]

According to a twenty-sixth aspect, in the computer program of the twenty-fifth aspect, the step of measuring electric resistance includes a step of measuring electric resistance of each of a plurality of spots of an electric conduction layer on the edge portion of the substrate.

[Twenty-seventh Aspect]

According to a twenty-seventh aspect, the computer program of the twenty-fifth or twenty-sixth aspect further causes execution of a step of cleaning the edge portion of the substrate. According to the twenty-seventh aspect, by cleaning the edge portion of the substrate which has been determined as defective based on the measured value of the electric resistance on the edge portion of the substrate, an oxide film formed on, and a foreign matter adhering to, the edge portion of the substrate can be removed to bring the substrate into the favorable state.

[Twenty-eighth Aspect]

According to a twenty-eighth aspect, the computer program of any one of the twenty-fifth to twenty-seventh aspects further causes execution of a step of measuring electric resistance of the electric conduction layer on the edge portion of the substrate subjected to the plating treatment after the plating treatment. According to the twenty-eighth aspect, the electric resistance of the electric conduction layer on the edge portion of the substrate is measured before and after the plating treatment, and it is thus possible to detect whether or not a leakage has occurred in the substrate holder during the plating treatment.

[Twenty-ninth Aspect]

According to a twenty-ninth aspect, there is provided a computer-readable non-transitory recording medium in which the computer program according to any one of twenty-fifth to twenty-eighth aspects is recorded.

[Thirtieth Aspect]

According to a thirtieth aspect, a plating method is provided, and the plating method includes the steps of: measuring electric resistance of an electric conduction layer on an edge portion of a substrate being the plating object before the substrate is held by the substrate holder; and determining a state of the substrate based on the measured electric resistance of the substrate. According to the thirtieth aspect, it is possible to find a defect of the substrate by measuring the electric resistance of the electric conduction layer on the edge portion of the substrate immediately before the start of the plating treatment. With the lapse of time, an oxide film may be formed on, or an organic matter volatilized from resist may adhere to, the electric conduction layer on the edge portion of the substrate. Therefore, by determining the state of the substrate immediately before the start of the plating treatment, favorable plating treatment can be performed.

[Thirty-first Aspect]

According to a thirty-first aspect, a plating device is provided, and the plating device comprises: a first resistance measuring instrument that measures electric resistance of an electric conduction layer on an edge portion of a substrate being a plating object; and a substrate holder for holding the substrate, wherein the first resistance measuring instrument is configured so as to measure electric resistance of the substrate before the substrate is held by the substrate holder, the plating device further comprising a holder resistance measuring module for measuring electric resistance of a substrate holder, wherein the substrate holder has an electric contact configured to feed a current to a held substrate and contactable with the substrate, the substrate holder is able to hold a testing substrate for measurement of electric resistance of the substrate holder, and is configured such that the electric contact comes into contact with the testing substrate in a state where the testing substrate is held, and the holder resistance measuring module includes: a test probe contactable with the testing substrate held in the substrate holder; and a second resistance measuring instrument for measurement of a resistance value between the electric contact and the probe via the testing substrate.

DESCRIPTION OF EMBODIMENTS

Figure 1:
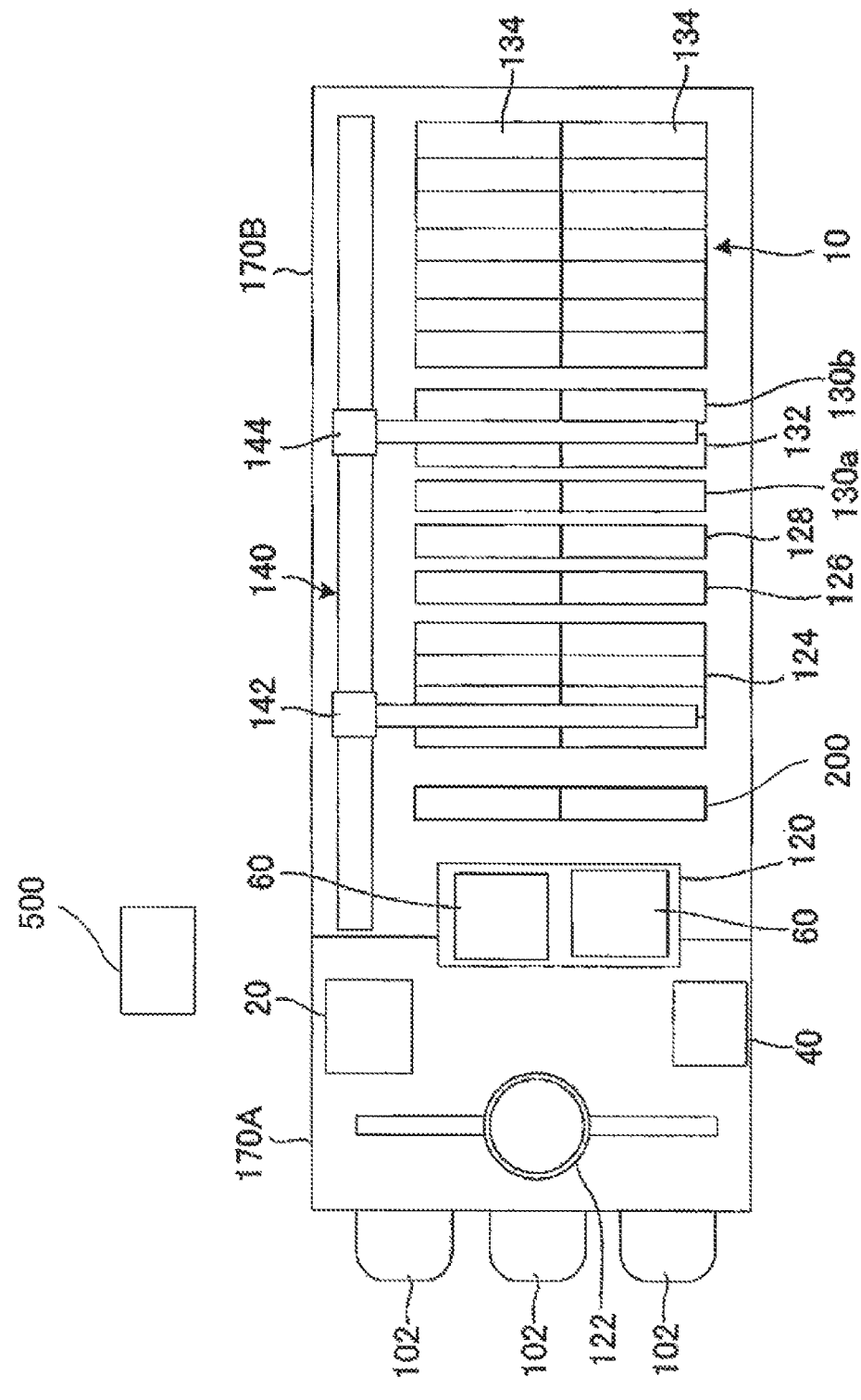
FIG. 1 is a general layout diagram of a plating device according to one embodiment.

In the following, embodiments of a plating device, a substrate holder, a resistance measuring module, and a substrate holder testing method according to the present invention will be described along with the accompanying drawings. In the accompanying drawings, each of the same or similar elements is provided with the same or similar reference numeral, and a repeated description of the same or similar element in each embodiment may be omitted. Further, a feature shown in each embodiment is applicable to another embodiment so long as the original and applied features are not contradictory to each other.

FIG. 1 is a general layout diagram of a plating device according to one embodiment. As shown in FIG. 1, this plating device is briefly divided into: a load/unload portion 170A that loads a substrate into a substrate holder 60 or unload the substrate from the substrate holder 60; and a treatment portion 170B that processes the substrate.

The load/unload portion 170A is provided with three FOUPs (Front-Opening Unified Pods) 102, an aligner 40 that aligns positions of an orientation flat, a notch, or the like of the substrate with a predetermined direction, and a spin rinse drier 20 that dries the substrate after plating treatment by rotating the substrate at a high speed. The FOUP 102 houses a plurality of substrates such as semiconductor wafers on multiple stages. In the vicinity of the spin rinse drier 20, a fixing unit 120 is provided where the substrate holder 60 is placed to set or remove the substrate. At the center of the units 102, 40, 20, 120, there is disposed a substrate carrier device 122 made up of a carrier robot for carrying the substrate between these units.

The fixing unit 120 is configured such that two substrate holders 60 are placeable thereon. In the fixing unit 120, a substrate is passed or received between one substrate holder 60 and the substrate carrier device 122, and thereafter a substrate is passed or received between the other substrate holder 60 and the substrate carrier device 122.

The treatment portion 170B of the plating device includes a resistance measuring module 200 described later, a stocker 124, a pre-wetting tank 126, a pre-soaking tank 128, a first cleaning tank 130a, a blow tank 132, a second cleaning tank 130b, and a plating tank 10. The resistance measuring module 200, described in detail later, is a module for measuring the electric resistance of the substrate holder 60. In the stocker 124, the substrate holder 60 is stored or temporarily stored. In the pre-wetting tank 126, the substrate is immersed into pure water. In the pre-soaking tank 128, an oxide film on the surface of a conductive layer such as a seed layer, which is formed on the surface of the substrate, is etched and removed. In the first cleaning tank 130a, the pre-soaked substrate is cleaned by a cleaning solution (pure water, etc.) along with the substrate holder 60. In the blow tank 132, the cleaned substrate is drained. In the second cleaning tank 130b, the plated substrate is cleaned by the cleaning solution along with the substrate holder 60. The resistance measuring module 200, the stocker 124, the pre-wetting tank 126, the pre-soaking tank 128, the first cleaning tank 130a, the blow tank 132, the second cleaning tank 130b, and the plating tank 10 are disposed in this order.

The plating tank 10 has a plurality of plating cells 134 including an overflow tank, for example. In each plating cell 134, one substrate is housed inside and the substrate is immersed into a plating solution held inside. A voltage is applied between the substrate and an anode in the plating cell 134, to thereby perform plating, such as copper plating, on the substrate surface. For example in the case of through-silicon via (TSV) plating, a barrier layer and/or an adhesion layer (e.g., Ta, Ti, TiW, TiN, TaN, Ru, Co, Ni, W, etc.) and a seed layer (Cu, Ru, Ni, Co, etc.) may be formed in a recess of the substrate before plated.

The plating device includes a substrate holder carrier device 140 that is located lateral to the above instruments, carries the substrate holder 60 with the substrate among these instruments, and has adopted a linear motor system, for example. This substrate holder carrier device 140 includes a first transporter 142 and a second transporter 144. The first transporter 142 is configured so as to carry the substrate among the resistance measuring module 200, the fixing unit 120, the stocker 124, the pre-wetting tank 126, the pre-soaking tank 128, the first cleaning tank 130a, and the blow tank 132. The second transporter 144 is configured so as to carry the substrate among the first cleaning tank 130a, the second cleaning tank 130b, the blow tank 132, and the plating tank 10. In another embodiment, the plating device may include any one of the first transporter 142 and the second transporter 144, and any one of the transporters may carry the substrate among the resistance measuring module 200, the fixing unit 120, the stocker 124, the pre-wetting tank 126, the pre-soaking tank 128, the first cleaning tank 130a, the second cleaning tank 130b, the blow tank 132, and the plating tank 10.

The plating device includes a control device 500 for controlling the entire operation of the plating device. Further, the control device 500 is configured so as to control the operation of the resistance measuring module 200 described later. The control device 500 can be made up of a general-purpose computer or a dedicated computer, including an input/output device, a display device, a storage device, and the like, and in the control device 500, a program for controlling the operation of the plating device can be installed. Further, the control device 500 can cause the plating device to be operated in a plating treatment mode and a maintenance mode. The plating treatment mode is a mode for performing plating treatment on the substrate, and the maintenance mode is a mode for maintaining the plating device, and for example, maintaining the substrate holder.

Figure 2:
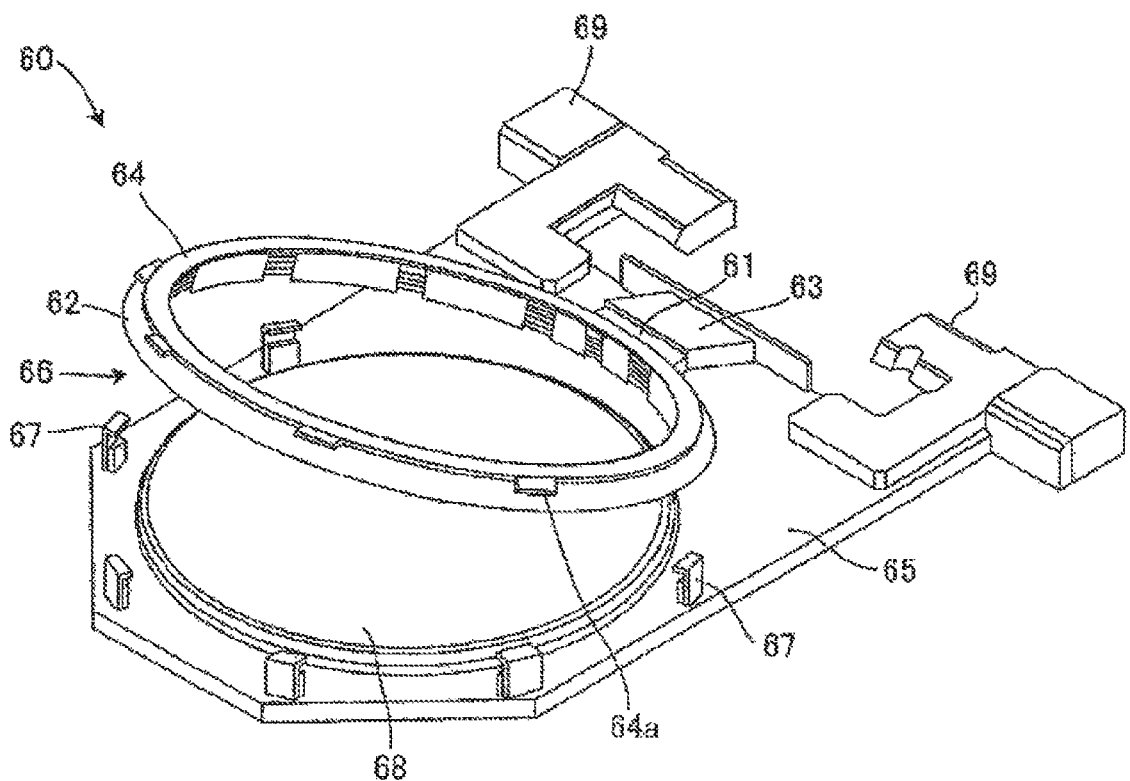
FIG. 2 is a perspective view of a substrate holder according to one embodiment, which is used in the plating device shown in FIG. 1.

FIG. 2 is a perspective view of the substrate holder 60 that is used in the plating device shown in FIG. 1. As shown in FIG. 2, the substrate holder 60 includes a first holding member 65 made of vinyl chloride, for example, and having a rectangular flat shape, and a second holding member 66 fitted openably/closably to this first holding member 65 via a hinge 63. A holding surface 68 for holding. the substrate is provided in the substantially center of the first holding member 65 of the substrate holder 60. Outside the holding surface 68 of the first holding member 65, reversed L-shaped dampers 67 each having a protrusion that protrudes inward are provided at regular intervals along the circumference of the holding surface 68.

A pair of substantially T-shaped hands 69, which serves as a support portion at the time of carrying, or supporting by suspension, the substrate holder 60, is coupled to the edge of the first holding member 65 of the substrate holder 60. In the stocker 124 shown in FIG. 1, the hands 69 are hung on the upper surface of the peripheral wall of the stocker 124, so that the substrate holder 60 is vertically supported by suspension. The hands 69 of the substrate holder 60 supported by suspension are held by the first transporter 142 or the second transporter 144, to carry the substrate holder 60. Also in the resistance measuring module 200, the pre-wetting tank 126, the pre-soaking tank 128, the cleaning tanks 130a, 130b, the blow tank 132, and the plating tank 10, the substrate holder 60 is supported by suspension on the respective peripheral walls thereof via the hands 69.

Further, an external contact 71 (cf. FIG. 4) to be connected to an external power source portion is provided on the hand 69. This external contact 71 is electrically connected to a plurality of electric contacts 73 (cf. FIG. 3) provided on the outer circumference of the holding surface 68 via a plurality of wires.

The second holding member 66 includes a base portion 61 fixed to the hinge 63, and a ring-like seal holder 62 fixed to the base portion 61. A press ring 64 for pressing and fixing the seal holder 62 to the first holding member 65 is rotatably mounted in the seal holder 62 of the second holding member 66. The press ring 64 has a plurality of externally protruding projections 64a on the outer circumference. The upper surface of the projection 64a and the lower surface of the inward protrusion of the damper 67 have taper surfaces inclined in directions opposite to each other along the rotational direction.

At the time of holding the substrate, the substrate is first placed on the holding surface 68 of the first holding member 65, with the second holding member 66 in an open state, and the second holding member 66 is then closed. Subsequently, the press ring 64 is rotated clockwise to slip the projection 64a of the press ring 64 into the inside (the lower side) of the inward protrusion of the damper 67. This makes the first holding member 65 and the second holding member 66 fastened to each other and locked via the taper surfaces provided respectively on the press ring 64 and the dampers 67, to hold the substrate. At the time of canceling the hold of the substrate, the press ring 64 is rotated counterclockwise, with the first holding member 65 and the second holding member 66 in the locked state. This makes the projection 64a of the press ring 64 removed from the reversed L-shaped dampers 67 to cancel the hold of the substrate.

Figure 3:
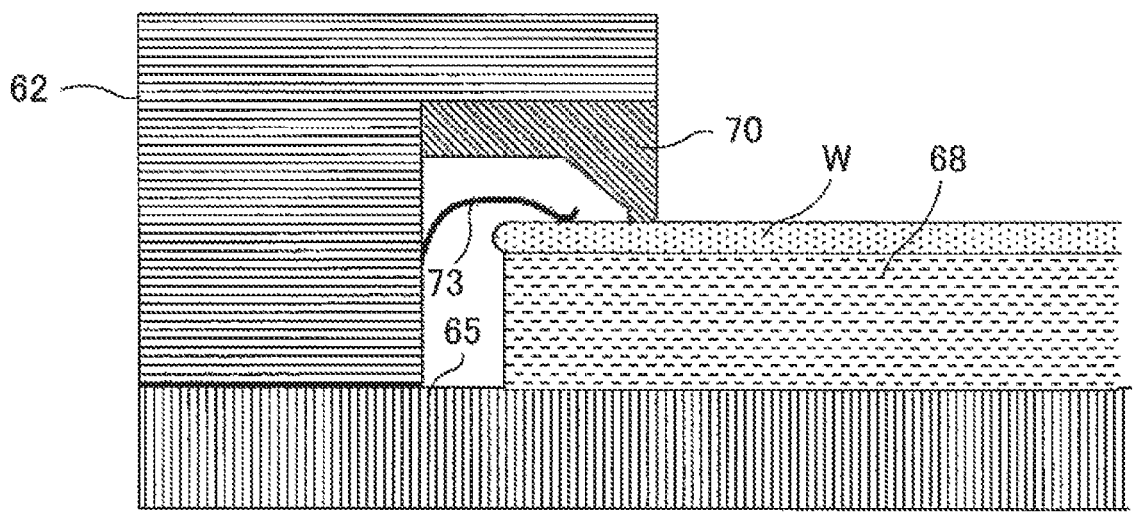
FIG. 3 is a sectional view showing an electric contact of the substrate holder shown in FIG. 2.

FIG. 3 is a sectional view showing the electric contact of the substrate holder 60 shown in FIG. 2. As shown in FIG. 3, the substrate W is placed on the holding surface 68 of the first holding member 65. A plurality of electric contacts 73 (one electric contact 73 in the figure), connected to a plurality of wires extending from the external contact 71 provided on the hand 69 shown in FIG. 2, are disposed between holding surface 68 and the first holding member 65.

When the substrate W is placed on the holding surface 68 of the first holding member 65, the plurality of electric contacts 73 are disposed outside the circumference of the substrate W such that the edges of the electric contacts 73 come into contact with the surface of the substrate W. Note that the conductive layer (seed layer) is formed on the surface of the substrate W, and a current can be allowed to flow in the substrate W by the electric contact 73 coming into contact with the conductive layer on the surface of the substrate W when the substrate W is held in the substrate holder 60.

A seal member 70, which is pressure-welded to the outer circumference of the surface of the substrate W when the substrate W is held in the substrate holder 60, is fitted to the surface (the lower surface in the figure) of the seal holder 62 which faces the first holding member 65. When the substrate W is held in the substrate holder 60, the edge of the seal holder 62 is pressure-welded to the first holding member 65 as shown in FIG. 3.

The plurality of electric contacts 73 are arranged along the circumference of the substrate W in an interior portion sandwiched between the seal member 70 and the seal holder 62. When the first holding member 65 and the second holding member 66 shown in FIG. 2 are locked, as shown in FIG. 3, the seal holder 62 is pressed to the first holding member 65, and the seal member 70 is pressed to the surface of the substrate W. This makes the edge portion of the substrate W and the electric contact 73 separated from the surface to be plated of the substrate W, and when the substrate holder 60 holding the substrate W is immersed into the plating solution to perform the plating treatment, the electric contact 73 and the edge portion of the substrate W do not come into contact with the plating solution.

In order to achieve plating with favorable in-plane uniformity, a current needs to flow uniformly in the plurality of electric contacts 73 of the substrate holder 60. However, when the electric resistance of a certain electric contact 73 is larger, a current flowing in that electric contact 73 decreases, and values of currents flowing in the electric contacts 73 around the above electric contact 73 increase, thus resulting in non-uniform plating. The electric resistance of the electric contact 73 is larger than the electric resistance in a normal state, in many cases, due to adhesion of a foreign matter or an oxide to the electric contact 73, due to adhesion of the plating solution to the electric contact 73 caused by leakage of the plating solution, due to contact of the electric contact 73 to the seed layer of the substrate W with an insufficient contact area caused by deformation or a fitting defect of the electric contact 73, or due to peeling of a coating member of the electric contact 73.

Figure 4:
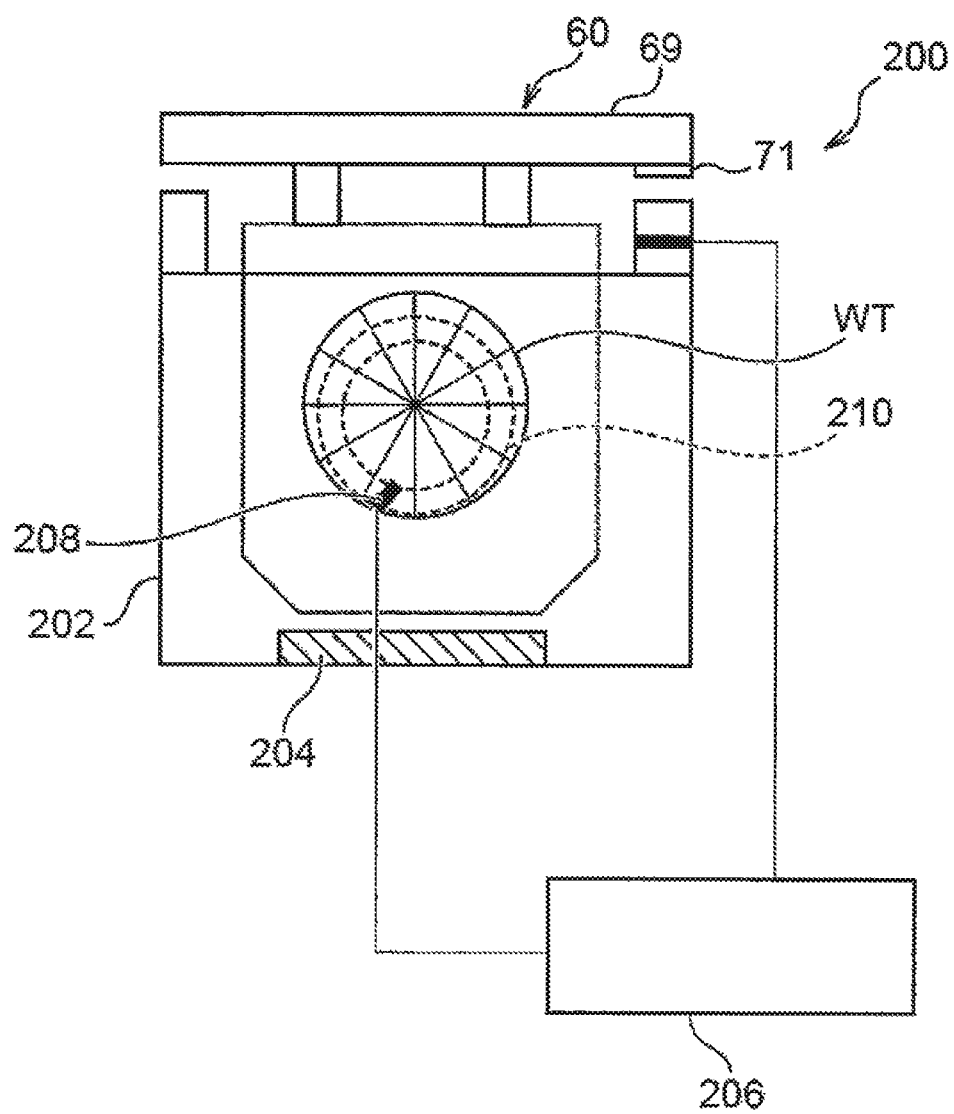
FIG. 4 is a front view schematically showing the resistance measuring module according to one embodiment.
Figure 5:
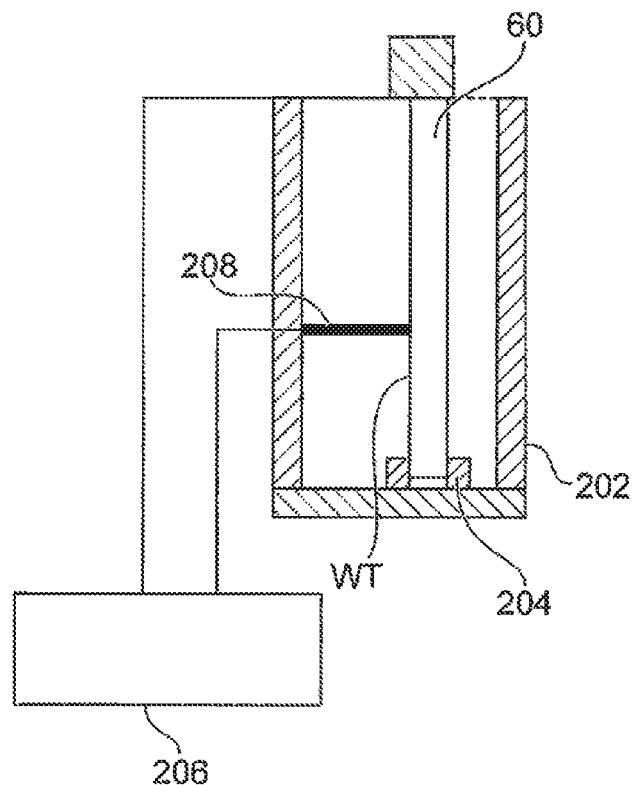
FIG. 5 is a side view of the resistance measuring module shown in FIG. 4.

Therefore, the plating device according to the present disclosure includes the resistance measuring module 200 for measuring the electric resistance of the electric contact 73 of the substrate holder 60. FIG. 4 is a front view schematically showing the resistance measuring module 200 according to one embodiment. FIG. 5 is a side view of the resistance measuring module 200 shown in FIG. 4. As shown in FIG. 4, the resistance measuring module 200 includes a measurement tank 202 for measuring the resistance of the substrate holder 60. A holder fixing portion 204 for fixing the substrate holder 60 is provided at the bottom of the measurement tank 202. The holder fixing portion 204 can be a recess into which the substrate holder 60 is inserted. Note that FIG. 4 shows a middle stage of placement of the substrate holder 60 in the measurement tank 202, and FIG. 5 shows a state where the substrate holder 60 is disposed in the measurement tank 202 and the substrate holder 60 is fixed to the holder fixing portion 204. When the substrate holder 60 is set in the measurement tank 202, the external contact 71 provided on the hand 69 of the substrate holder 60 is connected to one end of a resistance measuring instrument 206.

Figure 6:
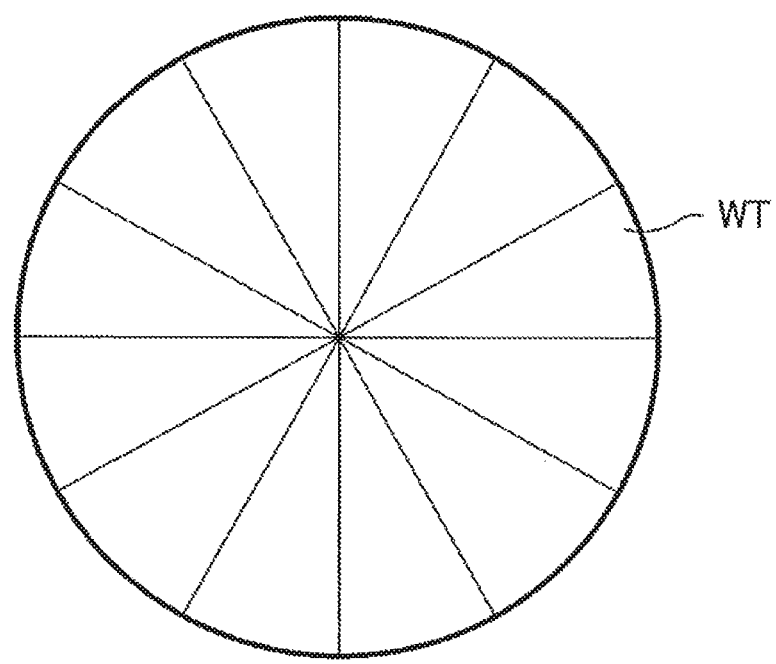
FIG. 6 is a view showing a testing substrate according to one embodiment.

In the resistance measuring module 200, a testing substrate WT for measuring resistance is held into the substrate holder 60 in order to measure the resistance value of the substrate holder 60. FIG. 6 is a view showing the testing substrate WT. The testing substrate WT has the same dimensions as the dimensions of the substrate W to be the plating object. Further, the testing substrate WT is configured such that a conductive layer (seed layer) is formed on the surface thereof or that the testing substrate WT has conductivity. However, as shown in FIG. 6, the testing substrate WT is electrically divided circumferentially into a plurality of regions. The number of regions of the testing substrate WT can be made the same as the number of electric contacts 73 of the substrate holder 60. In the example of FIG. 6, the testing substrate WT is divided into twelve regions. With the regions of the testing substrate WT electrically insulated from each other, it is possible to allow a current to flow independently in each region of the testing substrate WT from each electric contact 73 of the substrate holder 60.

As shown in FIGS. 4 and 5, the resistance measuring module 200 includes the resistance measuring instrument 206. The resistance measuring instrument 206 can be a general digital multi-meter. Further, the resistance measuring module 200 includes a test probe 208 that is contactable with the testing substrate WT held in the substrate holder 60. The test probe 208 is connected to the resistance measuring instrument 206. As shown in FIG. 5, the test probe 208 is brought into contact with each region of the testing substrate WT in a state where the substrate holder 60 holding the testing substrate WT is disposed in the measurement tank 202, thereby enabling measurement of the electric resistance of the substrate holder 60. Bringing the test probe 208 into contact with each region of the testing substrate WT makes it possible to measure the electric resistance of each electric contact 73 of the substrate holder 60 and the electric resistance of the wire from each electric contact 73 to each external contact 71. Previously measuring the resistance value of each region of the testing substrate WT, as a result, enables measurement of the electric resistance of the substrate holder 60. As described above, when there is abnormality in the electric contact 73 of the substrate holder 60, such as adhesion of a foreign matter thereto or deformation thereof, the electric resistance of the electric contact 73 increases. Hence it is possible to test whether or not the substrate holder 60 is abnormal by measuring the electric resistance of the substrate holder 60.

Figure 7:
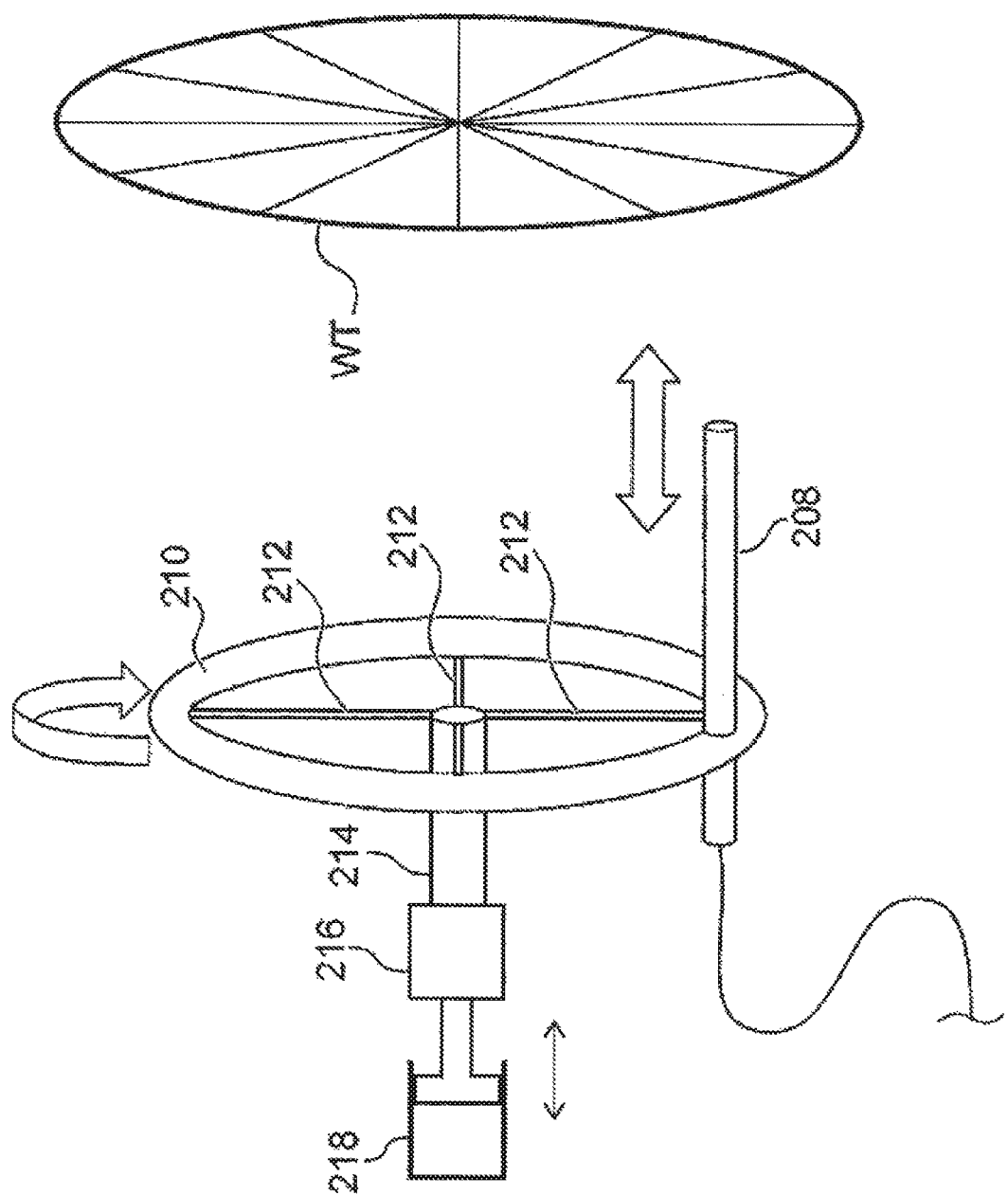
FIG. 7 is a schematic view showing a movement mechanism of a test probe according to one embodiment.

In one embodiment, the test probe 208 of the resistance measuring module 200 is configured so as to be movable in the in-plane direction of the testing substrate WT, especially in the circumferential direction of the testing substrate WT. Further, the test probe 208 is configured so as to be movable in a vertical direction to the plane of the testing substrate WT. FIG. 7 is a schematic view showing a movement mechanism of the test probe 208 according to one embodiment. As shown in FIG. 7, the test probe 208 is fitted to a ring-like support member 210. In the embodiment of FIG. 7, the number of test probes 208 is one. The test probe 208 is fitted to the support member 210 such that its tip faces the testing substrate WT. The support member 210 is fitted to a central shaft 214 via a spoke 212. The shaft 214 is connected to a motor 216 and can be rotated by the motor 216. Hence the test probe 208 is movable in the circumferential direction of the testing substrate WT. The motor 216 and the shaft 214 are connected to a pneumatic or hydraulic movement mechanism 218, and can move the support member 210 and the test probe 208 in a vertical direction to the plane of the testing substrate WT.

Figure 8:
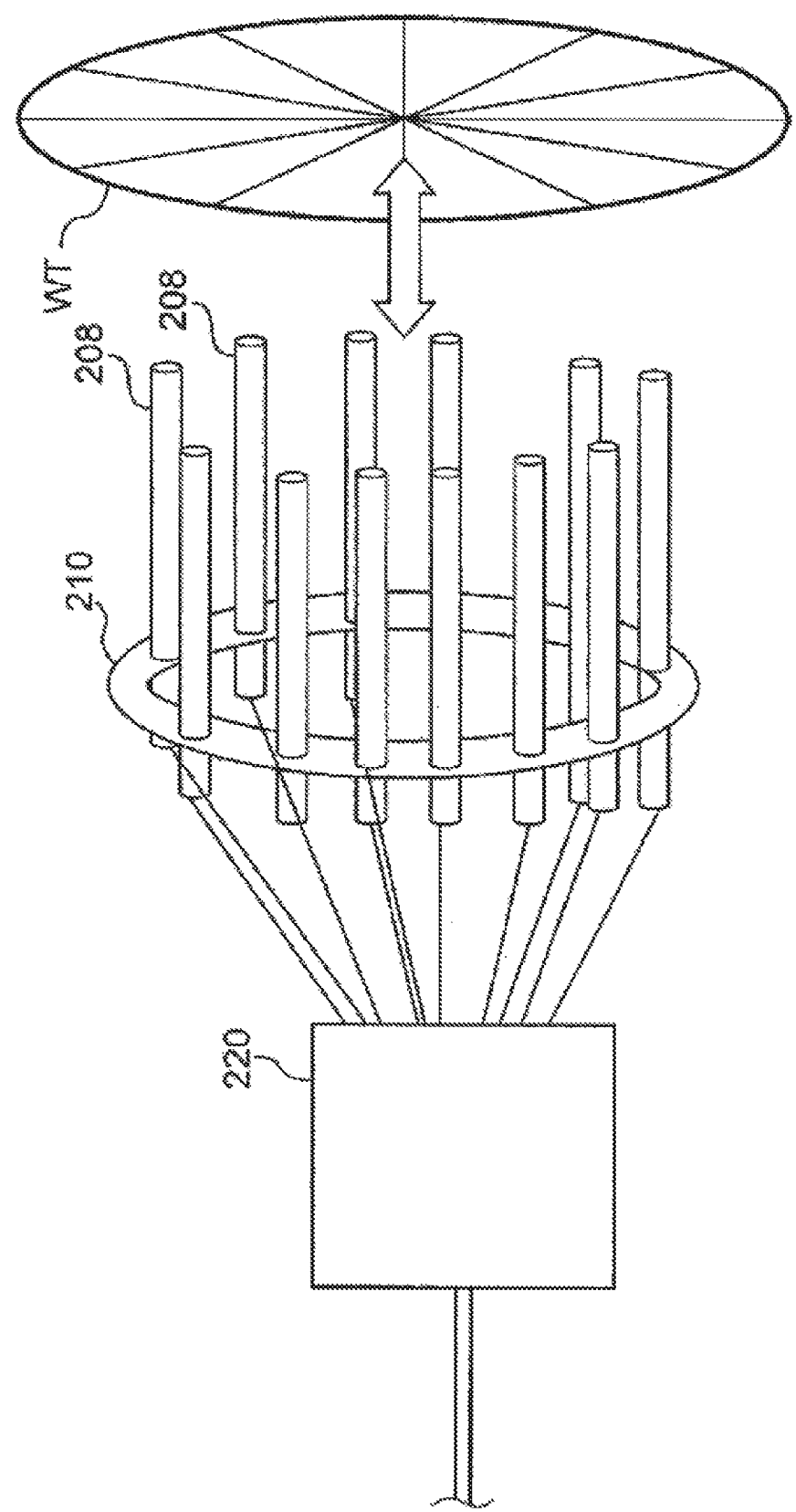
FIG. 8 is a schematic view showing the test probe according to one embodiment.

FIG. 8 is a schematic view showing the test probes 208 according to one embodiment. As shown in FIG. 8, the test probe 208 is fitted to a ring-like support member 210. In the embodiment of FIG. 8, twelve test probes 208 are provided at regular intervals, corresponding to the number of divided regions of the testing substrate WT and the number of electric contacts 73 of the substrate holder 60. In the embodiment shown in FIG. 8, each of the twelve test probes 208 is connected to the resistance measuring instrument 206 via a shift-over switch 220. Although not shown in FIG. 8, in the embodiment of FIG. 8, similarly to the embodiment of FIG. 7, the movement mechanism 218 is provided to move the support member 210 in the vertical direction to the plane of the testing substrate WT. In the resistance measuring module 200 according to the embodiment of FIG. 8, it is possible to simultaneously bring each of the twelve test probes 208 into contact with each region of the testing substrate WT. The electric resistance of each electric contact 73 of the substrate holder 60 can be measured while the connection of the wire is switched using the shift-over switch 220. Also in the embodiment of FIG. 8, similarly to the embodiment of FIG. 7, the mechanism for rotating the support member 210 holding the test probe 208 may be provided.

Figure 9:
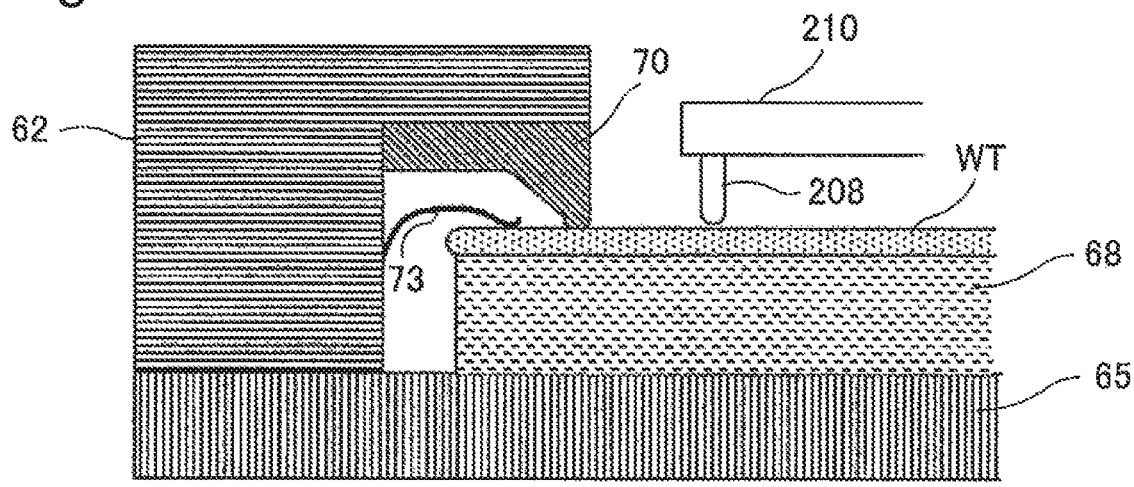
FIG. 9 is a sectional view showing a state at the time of measuring electric resistance of a substrate holder holding the testing substrate, according to one embodiment.

FIG. 9 is a sectional view showing a state at the time of measuring the electric resistance of the substrate holder 60 holding the testing substrate WT. As shown in FIG. 9, a current is allowed to flow from the external contact 71 to the electric contact 73 and an electric conduction plate 75, so that the electric resistance can be measured using the resistance measuring instrument 206 via the test probe 208.

Figure 10:
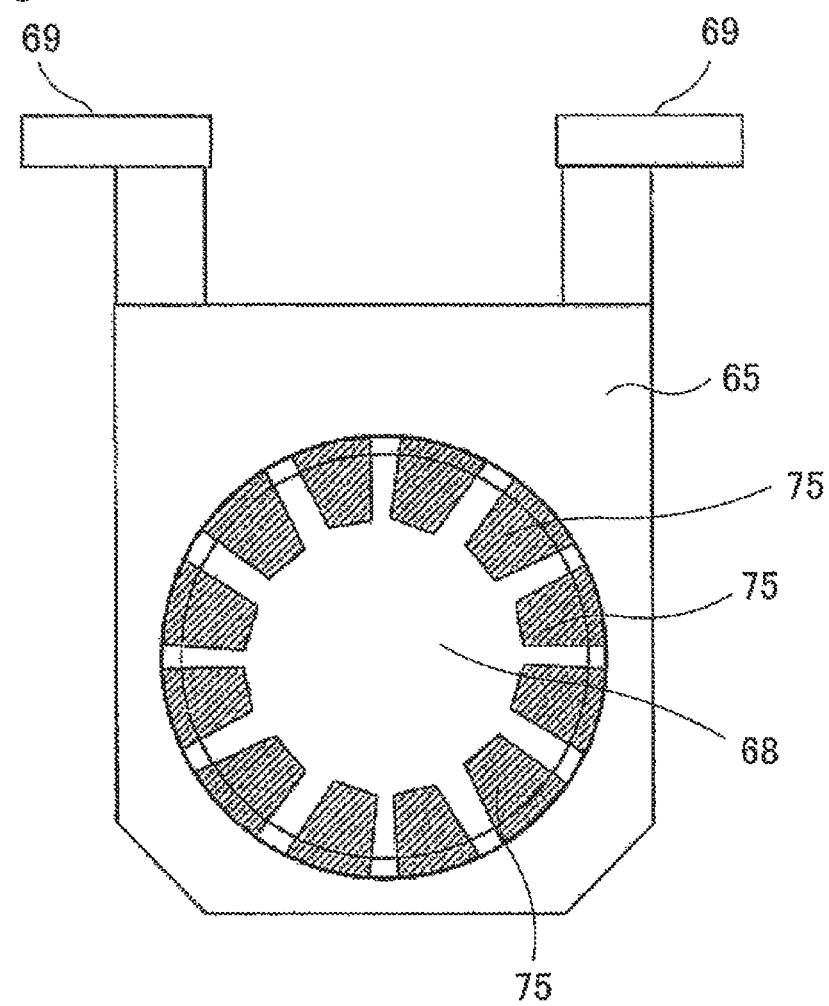
FIG. 10 is a plan view schematically showing the substrate holder according to one embodiment.
Figure 11:
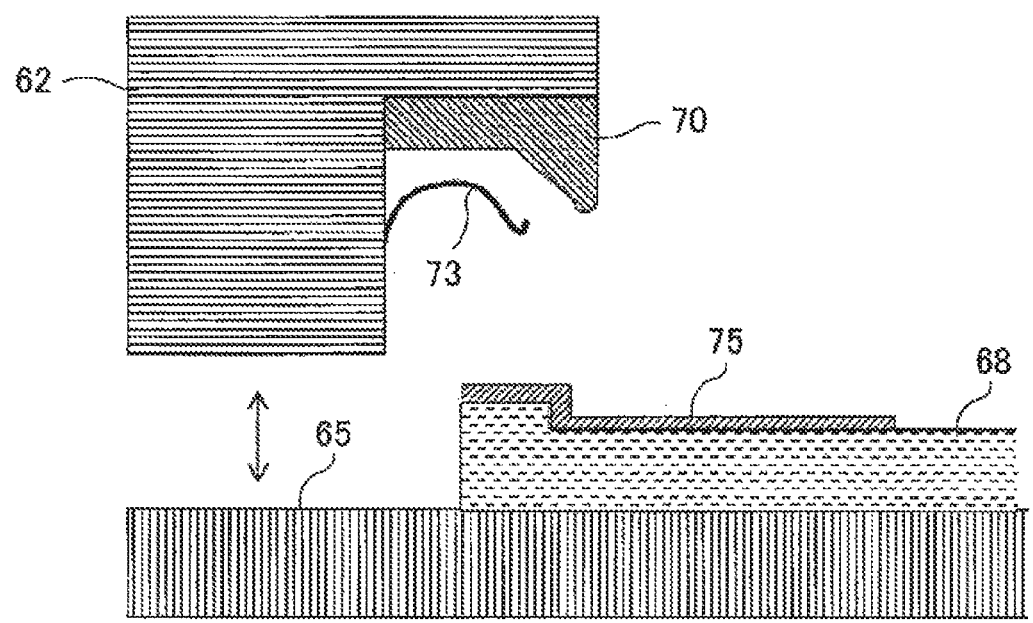
FIG. 11 is a sectional view showing an electric contact of the substrate holder shown in FIG. 10.
Figure 12:
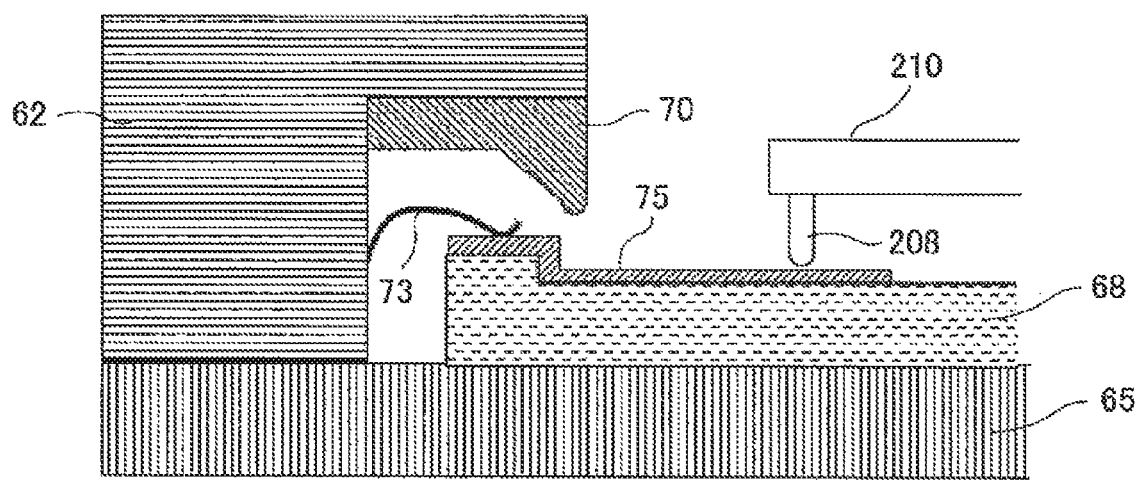
FIG. 12 is a sectional view showing a state at the time when a second holding member 66 is closed and electric resistance is measured in the substrate holder shown in FIG. 10.
Figure 13:
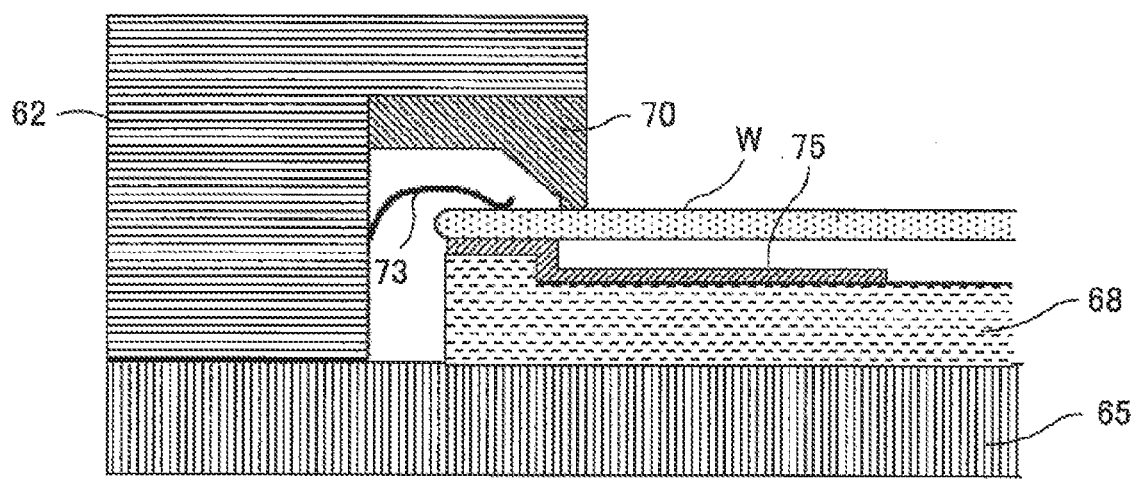
FIG. 13 is a sectional view showing a state where a substrate being a plating object is held in the substrate holder shown in FIG. 10.

As one embodiment, differently from the embodiment described above, the substrate holder 60 can be configured such that the electric resistance of the electric contact 73 of the substrate holder 60 can be measured without using the testing substrate WT. FIG. 10 is a plan view schematically showing the substrate holder 60 according to one embodiment. In FIG. 10, the first holding member 65 of the substrate holder 60 is mainly shown and the second holding member 66 is omitted. FIG. 11 is a sectional view showing an electric contact of the substrate holder 60 shown in FIG. 10. FIG. 11 shows a state where the second holding member 66 including the seal holder 62 is opened. FIG. 12 is a sectional view showing a state at the time when the second holding member 66 is closed and the electric resistance is measured in the substrate holder 60 shown in FIG. 10. FIG. 13 is a sectional view showing a state where the substrate W being a plating object is held in the substrate holder 60 shown in FIG. 10.

The substrate holder 60 shown in FIGS. 10 to 13 has basically the same structure as that of the substrate holder 60 shown in FIGS. 2 and 3. However, in the substrate holder 60 shown in FIGS. 10 to 13, differently from the substrate holder 60 shown in FIGS. 2 and 3, the electric conduction plate 75 is provided on the holding surface 68. As shown in FIG. 12, the electric conduction plate 75 is disposed in a position where the electric contact 73 comes into contact with the electric conduction plate 75 in a state where the second holding member 66 including the seal holder 62 is closed without the substrate W. Further, as shown in FIG. 10, twelve electric conduction plates 75 are provided and independently and electrically contactable to the twelve respective electric contacts 73. Although the substrate holder of the present embodiment includes twelve electric contacts, a plurality of substrate holders may only be disposed such that electricity can be fed in a practically uniform manner to the entire substrate surface, and the number of substrate holders is not limited to twelve. The number of electric contacts and the number of electric conduction plates are made the same. At the time of measuring the electric resistance of the substrate holder 60, as shown in FIG. 12, the electric conduction plate 75 is brought into contact with the test probe 208 in the state where the second holding member 66 is closed without the substrate W. In this state, a current is allowed to flow from the external contact 71 to the electric contact 73 and the electric conduction plate 75, so that the electric resistance can be measured using the resistance measuring instrument 206 via the test probe 208. The test probe 208, its support structure, and the movement mechanism can be made similar to those of the embodiments shown in FIGS. 4, 5, 7, and 8. According to the substrate holder 60 of FIGS. 10 to 13, it is possible to measure the electric resistance of the substrate holder 60 without using the testing substrate WT. Note that the number of electric conduction plates may not be more than one, and there may be used an electric conduction plate including a plurality of regions which are electrically insulated from each other on the electric conduction plate entirely or partially and are the same in number as the electric contacts.

Figure 14:
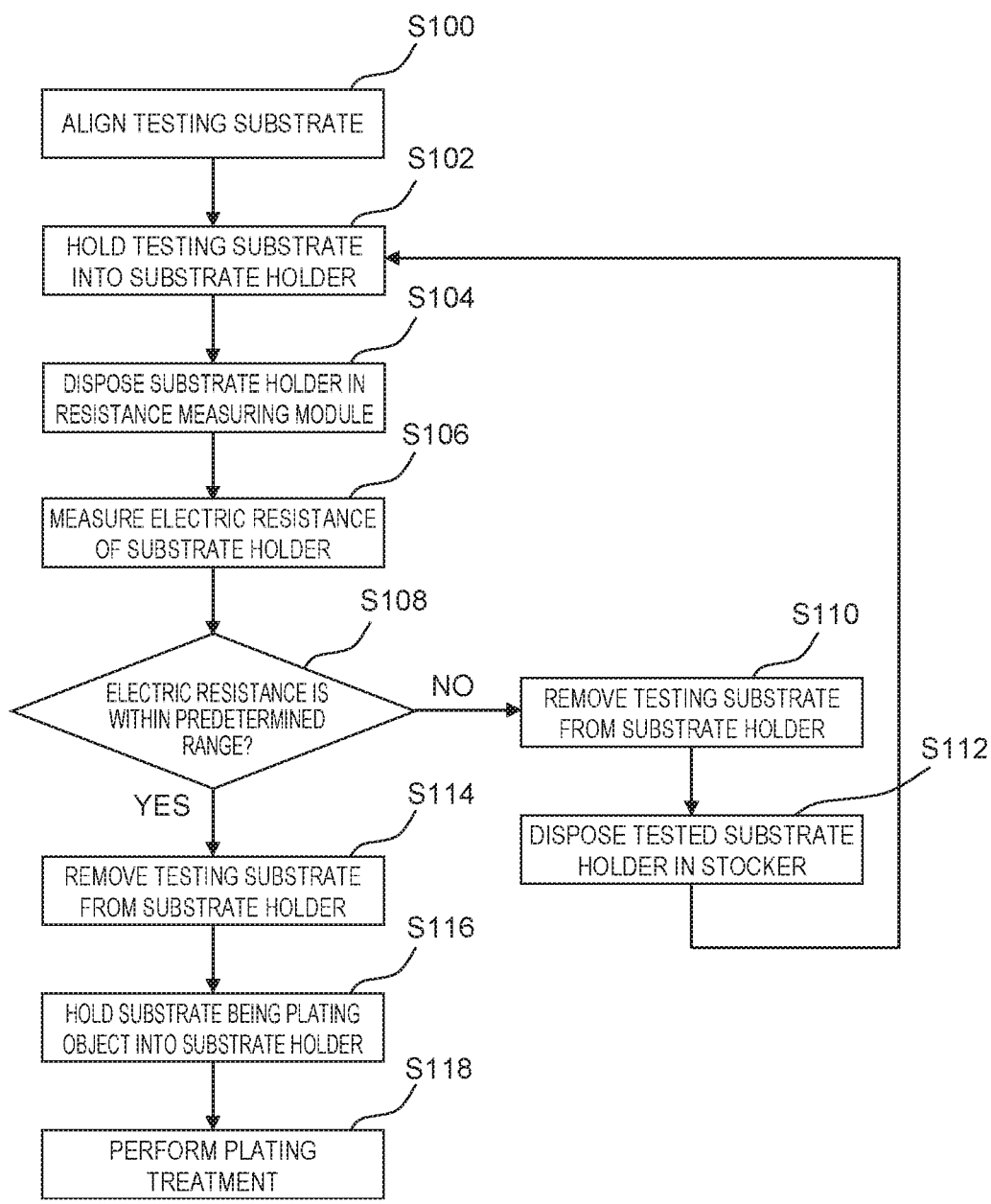
FIG. 14 is a flowchart showing a substrate holder testing method according to one embodiment.

FIG. 14 is a flowchart showing a substrate holder testing method according to one embodiment. FIG. 14 shows the testing method that is used in the case of testing the substrate holder 60 before the plating treatment is performed on the substrate W. The testing method shown in FIG. 14 can be performed by using the plating device, the substrate holder, the testing substrate, and the resistance measuring module according to the embodiments described above.

First, the testing substrate WT is disposed in the aligner 40 before the start of plating the substrate W that is the plating object. The testing substrate WT can be disposed in the aligner 40 by using the substrate carrier device 122. The testing substrate WT is aligned with a predetermined direction by the aligner 40 (S100). Next, in the fixing unit 120, the testing substrate WT is held into the substrate holder 60 (S102). Then, the substrate holder 60 holding the testing substrate WT is disposed in the resistance measuring module 200 (S104), More specifically, the substrate holder 60 is disposed in the measurement tank 202 by using the first transporter 142 such that the substrate holder 60 is fixed to the holder fixing portion 204. Next, the electric resistance of the substrate holder 60 is measured in the resistance measuring module 200 (S106). More specifically, the test probe 208 is brought into contact with the testing substrate WT, and electric resistance of an electric path is measured, the electric path being from the external contact 71 of the substrate holder 60 to the testing substrate WT through the internal wires of the substrate holder 60 and the electric contact 73. The electric resistance of each electric contact 73 of the substrate holder 60 is measured. In other words, the test probe 208 is brought into contact with each divided region of the testing substrate WT to measure the electric resistance of the substrate holder 60. The resistance measuring module 200 including one test probe 208 as shown in FIG. 7 may be used, or the resistance measuring module 200 including a plurality of test probes 208 as shown in FIG. 8 may be used. The measured electric resistance is transferred to the control device 500. Next, the control device 500 determines whether or not the measured electric resistance of the substrate holder 60 is within a predetermined range (S108). In one embodiment, electric resistance of a normal substrate holder 60 is measured in advance, and the predetermined range can then be determined based on the measured normal electric resistance value. For example, a range within 20% from an average value of the resistance of each electric contact 73 of the normal substrate holder 60 can be taken as the predetermined range. As one example of the determination, the substrate holder 60 can be determined as the normal substrate holder 60 when all the resistance values of the respective electric contacts 73 are within the predetermined range. Further, when a variation among the resistance values of the respective electric contacts 73 is within 10%, the substrate holder 60 may be determined as the normal substrate holder 60. For example, the variation can be determined from a difference between the maximum value and the minimum value, or the maximum divergence from the average value. The variation among the resistance values of the respective electric contacts 73 is preferably made smaller when the plating is performed with a higher current density. Further, at the time of measuring the resistance values of the respective electric contacts 73, the resistance value of the same electric contact 73 may be measured more than once and an average value of the measured values may be taken as the resistance value of each electric contact 73. When the electric resistance of the substrate holder 60 is not in the predetermined range in S108, the testing substrate WT is removed from the substrate holder 60 (S110). At this time, the control device 500 may notify a user of the abnormality in the substrate holder 60 by using an alarm, a warming display, or the like. The substrate holder 60 with its electric resistance not in the predetermined range is a substrate holder with abnormality and thus not usable in the plating treatment, and hence the substrate holder 60 is returned to the stocker 124 (S112). The failed substrate holder 60 may be stored into the control device 500 so as not to be used in the plating treatment later. The failed substrate holder 60 may be subjected to maintenance, such as cleaning treatment, offline. After S112, the testing substrate WT is held into a new substrate holder 60 (S102), and the same test is conducted. When the electric resistance of the substrate holder 60 is in the predetermined range in S108, the testing substrate WT is removed from the substrate holder 60 (S114) and the substrate W being the plating object is held into the same substrate holder 60 (S116). Thereafter, the subsequent plating treatment is performed while the substrate W is held in the substrate holder 60 (S118).

As thus described, before the plating treatment is performed on the substrate W, the substrate holder 60 to be used can be tested. Hence it is possible to prevent a failure in the plating treatment due to a defect of the substrate holder 60. Further, the failed substrate holder 60 can be subjected to the maintenance offline, so that the plating treatment itself can be performed continuously.

Figure 15:
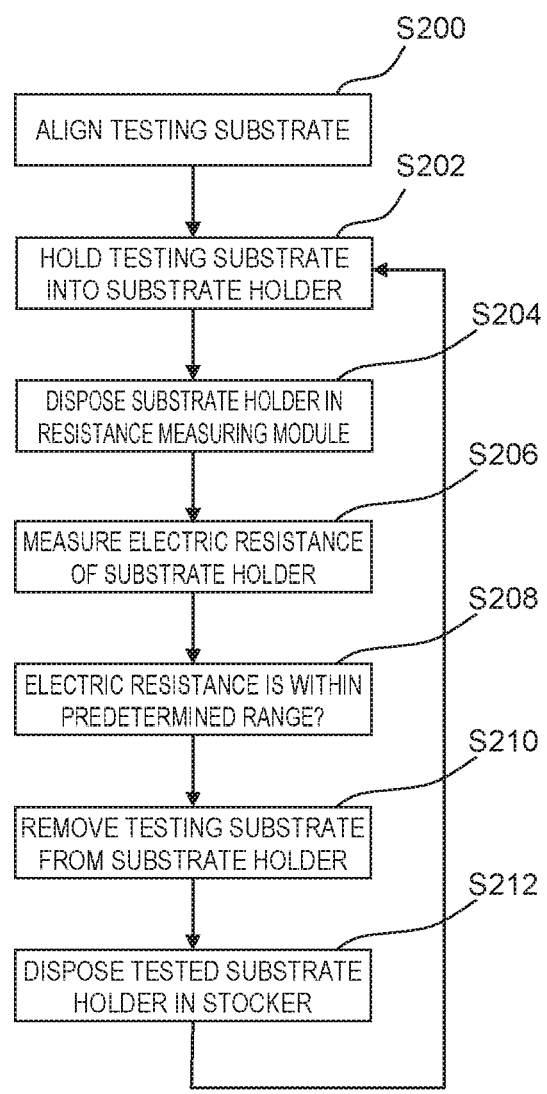
FIG. 15 is a flowchart showing a substrate holder testing method according to one embodiment.

FIG. 15 is a flowchart showing a substrate holder testing method according to one embodiment. FIG. 15 shows a flowchart of a case where the plating treatment is not performed on the substrate W, and the mode of the plating device is switched to the maintenance mode to test only the same substrate holder 60. The testing method shown in FIG. 15 can be performed by using the plating device, the substrate holder, the testing substrate, and the resistance measuring module according to the embodiments described above.

First, in the control device 500, the mode of the plating device is switched to the maintenance mode for testing the substrate holder 60. The testing substrate WT is disposed in the aligner 40, and the testing substrate WT is aligned with a predetermined direction (S200). Next, in the fixing unit 120, the testing substrate WT is held into the substrate holder 60 (S202). Then, the substrate holder 60 holding the testing substrate WT is disposed in the resistance measuring module 200 (S204). More specifically, the substrate holder 60 is placed in the measurement tank 202 by the first transporter 142 such that the substrate holder 60 is fixed to the holder fixing portion 204. Next, the electric resistance of the substrate holder 60 is measured in the resistance measuring module 200 (S206). More specifically, the test probe 208 is brought into contact with the testing substrate WT, and electric resistance of an electric path is measured, the electric path being from the external contact 71 of the substrate holder 60 to the testing substrate WT through the internal wires of the substrate holder 60 and the electric contact 73. The electric resistance of each electric contact 73 of the substrate holder 60 is measured. In other words, the test probe 208 is brought into contact with each divided region of the testing substrate WT to measure the electric resistance of the substrate holder 60. The resistance measuring module 200 including one test probe 208 as shown in FIG. 7 may be used, or the resistance measuring module 200 including a plurality of test probes 208 as shown in FIG. 8 may be used. The measured electric resistance is transferred to the control device 500. Next, the control device 500 determines whether or not the measured electric resistance of the substrate holder 60 is within a predetermined range (S208). In one embodiment, electric resistance of a normal substrate holder 60 is measured in advance, and the predetermined range can then be determined based on the measured normal electric resistance. For example, a range within 20% from an average value of the resistance of each electric contact 73 of the normal substrate holder 60 can be taken as the predetermined range. As one example of the determination, the substrate holder 60 can be determined as the normal substrate holder 60 when all the resistance values of the respective electric contacts 73 are within the predetermined range. Further, when a variation among the resistance values of the respective electric contacts 73 is within 10%, the substrate holder 60 may be determined as the normal substrate holder 60. For example, the variation can be determined from a difference between the maximum value and the minimum value, or the maximum divergence from the average value. The variation among the resistance values of the respective electric contacts 73 is preferably made smaller when the plating is performed with a higher current density. Further, at the time of measuring the resistance values of the respective electric contacts 73, the resistance value of the same electric contact 73 may be measured more than once and an average value of the measured values may be taken as the resistance value of each electric contact 73. The test result of S208 is stored into the control device 500. When the electric resistance of the substrate holder 60 is not in the predetermined range in S208, the control device 500 may notify the user of the abnormality in the substrate holder 60 by using an alarm, a warming display, or the like. When the determination of S208 is completed, the testing substrate WT is removed from the substrate holder 60 (S210), and the tested substrate holder 60 is disposed in the stocker 124 (S212). Thereafter, the testing substrate WT is held into the next substrate holder 60, and the same test is repeated. When the test on all the substrate holders 60 is completed, the maintenance mode of the plating device is finished.

In the testing method as thus described, it is possible to test all the substrate holders 60 in the plating device. The substrate holder 60, found abnormal in the test, can be individually subjected to the maintenance such as cleaning treatment. For example, only the substrate holder 60, found not abnormal in the test, can be left in the plating device to be subjected to the plating treatment, whereas the substrate holder 60, found abnormal, can be subjected to the maintenance offline.

Figure 16:
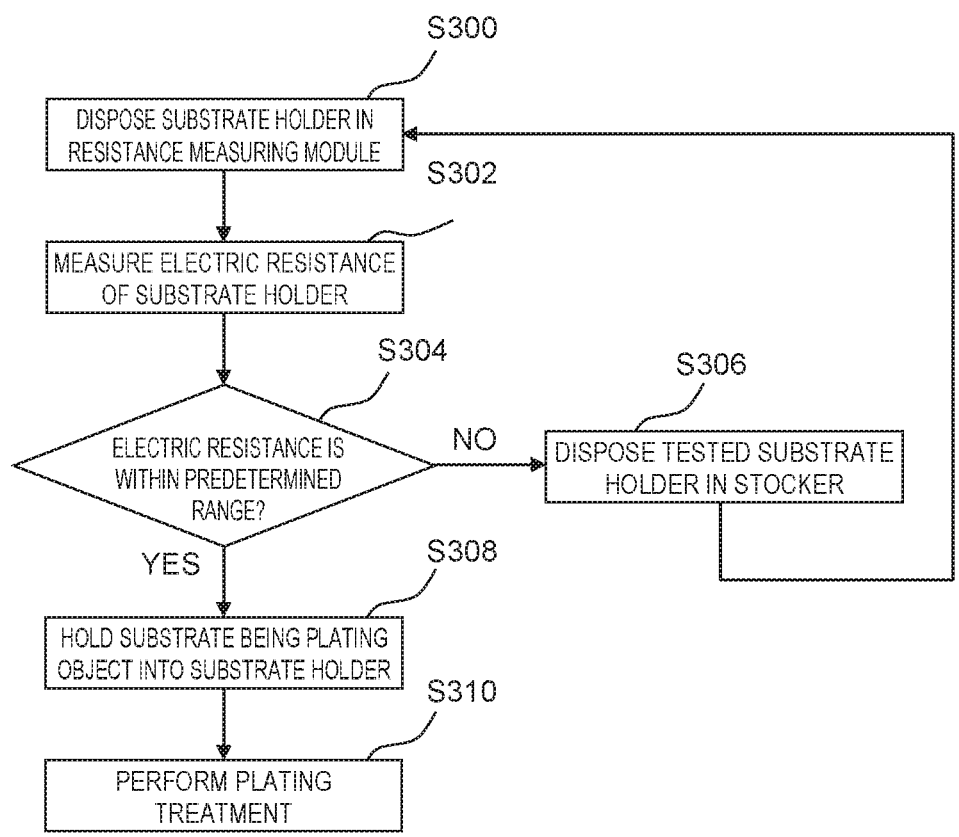
FIG. 16 is a flowchart showing a substrate holder testing method according to one embodiment.

FIG. 16 is a flowchart showing a substrate holder testing method according to one embodiment. FIG. 16 shows a testing method that is used in the case of testing the substrate holder 60 before the plating treatment is performed on the substrate W. FIG. 16 shows a flowchart for testing the substrate holder 60 shown in FIGS. 10 to 13, for example, without using the testing substrate WT.

First, substrate holder 60 is disposed in the resistance measuring module 200 before the start of plating the substrate W being the plating object (S300). More specifically, the substrate holder 60 is disposed in the measurement tank 202 by using the first transporter 142 such that the substrate holder 60 is fixed to the holder fixing portion 204. Next, the electric resistance of the substrate holder 60 is measured in the resistance measuring module 200 (S302). More specifically, the test probe 208 is brought into contact with the electric conduction plate 75 of the substrate holder 60, and electric resistance of an electric path is measured, the electric path being from the external contact 71 of the substrate holder 60 to the electric conduction plate 75 through the internal wires of the substrate holder 60 and the electric contact 73. The electric resistance of each electric contact 73 of the substrate holder 60 is measured. The resistance measuring module 200 including one test probe 208 as shown in FIG. 7 may be used, or the resistance measuring module 200 including a plurality of test probes 208 as shown in FIG. 8 may be used. The measured electric resistance is transferred to the control device 500. Next, the control device 500 determines whether or not the measured electric resistance of the substrate holder 60 is within a predetermined range (S304). In one embodiment, electric resistance of a normal substrate holder 60 is measured in advance, and the predetermined range can then be determined based on the measured normal electric resistance. For example, a range within 20% from an average value of the resistance of each electric contact 73 of the normal substrate holder 60 can be taken as the predetermined range. As one example of the determination, the substrate holder 60 can be determined as the normal substrate holder 60 when all the resistance values of the respective electric contacts 73 are within the predetermined range. Further, when a variation among the resistance values of the respective electric contacts 73 is within 10%, the substrate holder 60 may be determined as the normal substrate holder 60. For example, the variation can be determined from a difference between the maximum value and the minimum value, or the maximum divergence from the average value. The variation among the resistance values of the respective electric contacts 73 is preferably made smaller when the plating is performed with a higher current density. Further, at the time of measuring the resistance values of the respective electric contacts 73, the resistance value of the same electric contact 73 may be measured more than once and an average value of the measured values may be taken as the resistance value of each electric contact 73. When the electric resistance of the substrate holder 60 is not in the predetermined range in S304, the substrate holder is determined to be a substrate holder with abnormality and is thus not usable in the plating treatment, and hence the substrate holder 60 is returned to the stocker 124 (S306). At this time, the control device 500 may notify a user of the abnormality in the substrate holder 60 by using an alarm, a warming display, or the like. The failed substrate holder 60 may be stored into the control device 500 so as not to be used in the plating treatment thereafter. The failed substrate holder 60 may be subjected to maintenance, such as cleaning treatment, offline. After S306, a new substrate holder 60 is disposed in the resistance measuring module 200, and the same test is conducted. When the electric resistance of the substrate holder 60 is in the predetermined range in 5304, the substrate W being the plating object is held into the same substrate holder 60 (S308). Thereafter, the subsequent plating treatment is performed while the substrate W is held in the substrate holder 60 (S310).

As thus described, before the plating treatment is performed on the substrate W, the substrate holder 60 to be used can be tested. Hence it is possible to prevent a failure in the plating treatment due to a defect of the substrate holder 60. Further, the failed substrate holder 60 can be subjected to the maintenance offline, so that the plating treatment itself can be performed continuously. With no testing substrate WT used, the time for holding/releasing the testing substrate WT is not required.

Figure 17:
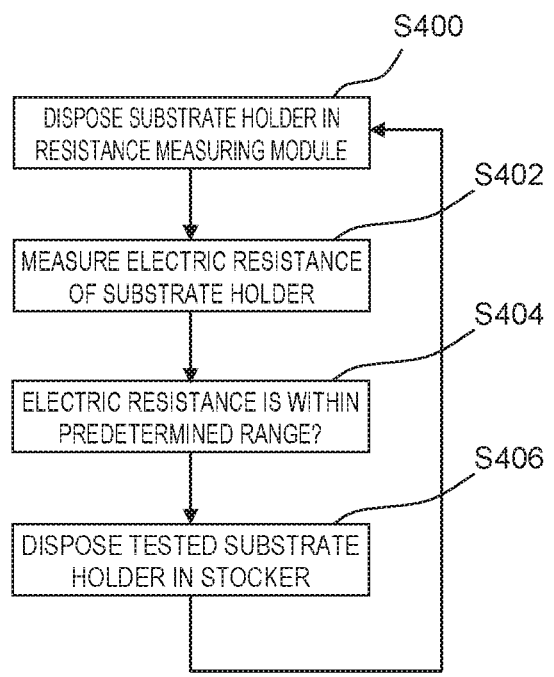
FIG. 17 is a flowchart showing a substrate holder testing method according to one embodiment.
Figure 18:
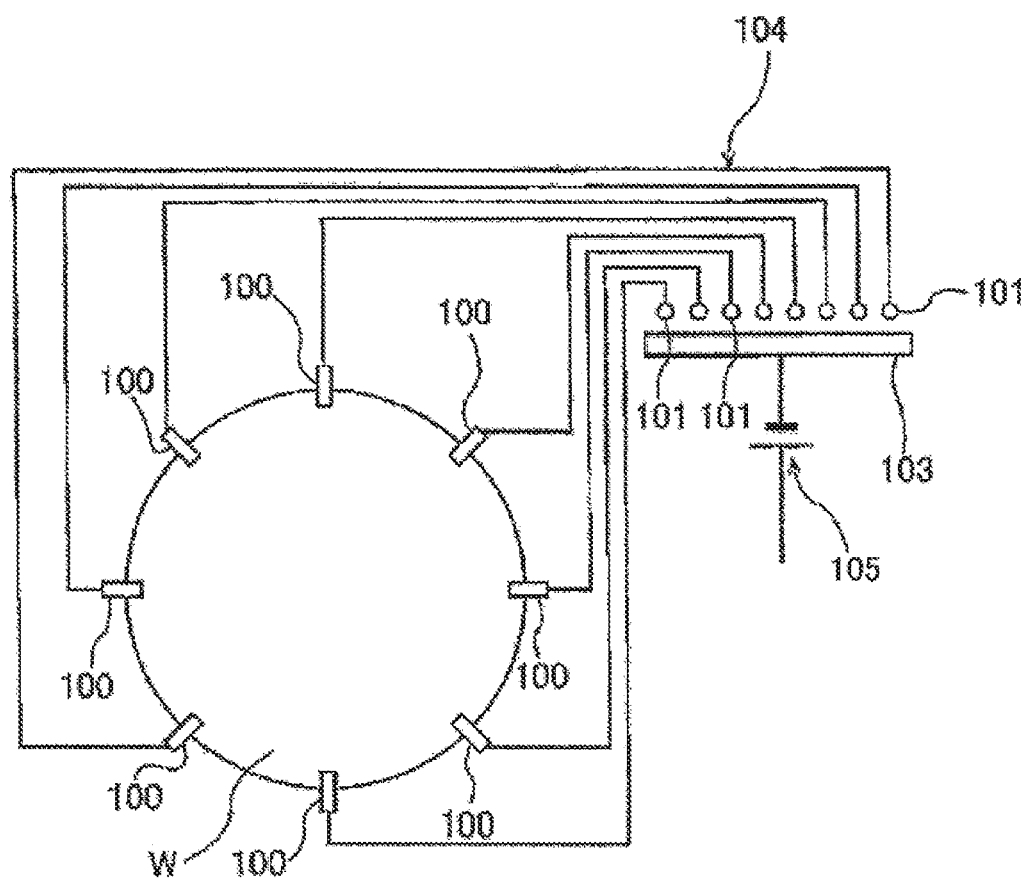
FIG. 18 is a schematic view showing an electric path of the substrate holder.

FIG. 17 is a flowchart showing a substrate holder testing method according to one embodiment. FIG. 17 shows a flowchart of a case where the plating treatment is not performed on the substrate W, and the mode of the plating device is switched to the maintenance mode to test only the same substrate holder 60. Further, FIG. 17 shows a flowchart for testing the substrate holder 60 shown in FIGS. 10 to 13, for example, without using the testing substrate WT.

First, in the control device 500, the mode of the plating device is switched to the maintenance mode for testing the substrate holder 60. First, the substrate holder 60 is disposed in the resistance measuring module 200 (S400). More specifically, the substrate holder 60 is disposed in the measurement tank 202 by using the first transporter 142 such that the substrate holder 60 is fixed to the holder fixing portion 204. Next, the electric resistance of the substrate holder 60 is measured in the resistance measuring module 200 (S402). More specifically, the test probe 208 is brought into contact with the electric conduction plate 75 of the substrate holder 60, and electric resistance of an electric path is measured, the electric path being from the external contact 71 of the substrate holder 60 to the electric conduction plate 75 through the internal wires of the substrate holder 60 and the electric contact 73. The electric resistance of each electric contact 73 of the substrate holder 60 is measured. The resistance measuring module 200 including one test probe 208 as shown in FIG. 7 may be used, or the resistance measuring module 200 including a plurality of test probes 208 as shown in FIG. 8 may be used. The measured electric resistance is transferred to the control device 500. Subsequently, in the control device 500, it is determined whether or not the measured electric resistance of the substrate holder 60 is within a predetermined range (S404). In one embodiment, electric resistance of a normal substrate holder 60 is measured in advance, and the predetermined range can then be determined based on the measured normal electric resistance. For example, a range within 20% from an average value of the resistance of each electric contact 73 of the normal substrate holder 60 can be taken as the predetermined range. As one example of the determination, the substrate holder 60 can be determined as the normal substrate holder 60 when all the resistance values of the respective electric contacts 73 are within the predetermined range. Further, when a variation among the resistance values of the respective electric contacts 73 is within 10%, the substrate holder 60 may be determined as the normal substrate holder 60. For example, the variation can be determined from a difference between the maximum value and the minimum value, or the maximum divergence from the average value. The variation among the resistance values of the respective electric contacts 73 is preferably made smaller when the plating is performed with a higher current density. Further, at the tine of measuring the resistance values of the respective electric contacts 73, the resistance value of the same electric contact 73 may be measured more than once and an average value of the measured values may be taken as the resistance value of each electric contact 73. The test result of S404 is stored into the control device 500. When the electric resistance of the substrate holder 60 is not in the predetermined range in S404, the control device 500 may notify the user of the abnormality in the substrate holder 60 by using an alarm, a warming display, or the like. When the test of S404 is completed, the tested substrate holder 60 is disposed in the stocker 124 (S406). Thereafter, the same test is repeatedly performed on the next substrate holder 60. When the test on all the substrate holders 60 is completed. the maintenance mode of the plating device is finished.

In the testing method as thus described, it is possible to test all the substrate holders 60 in the plating device. The substrate holder 60, found abnormal in the test, can be individually subjected to the maintenance such as cleaning treatment. For example, only the substrate holder 60, found not abnormal in the test, can be left in the plating device to be subjected to the plating treatment, whereas the substrate holder 60, found abnormal, can be subjected to the maintenance offline. With no testing substrate WT used, the time for holding/releasing the testing substrate WT is not required.

In the following, embodiments of a plating device and a substrate holder used in the plating device according to the present invention will be described along with the accompanied drawings. In the accompanying drawings, each of the same or similar elements is provided with the same or similar reference numeral, and a repeated description of the same or similar element in each embodiment may be omitted. Further, a feature shown in each embodiment is applicable to another embodiment so long as the original and applied features are not contradictory to each other.

Figure 19:
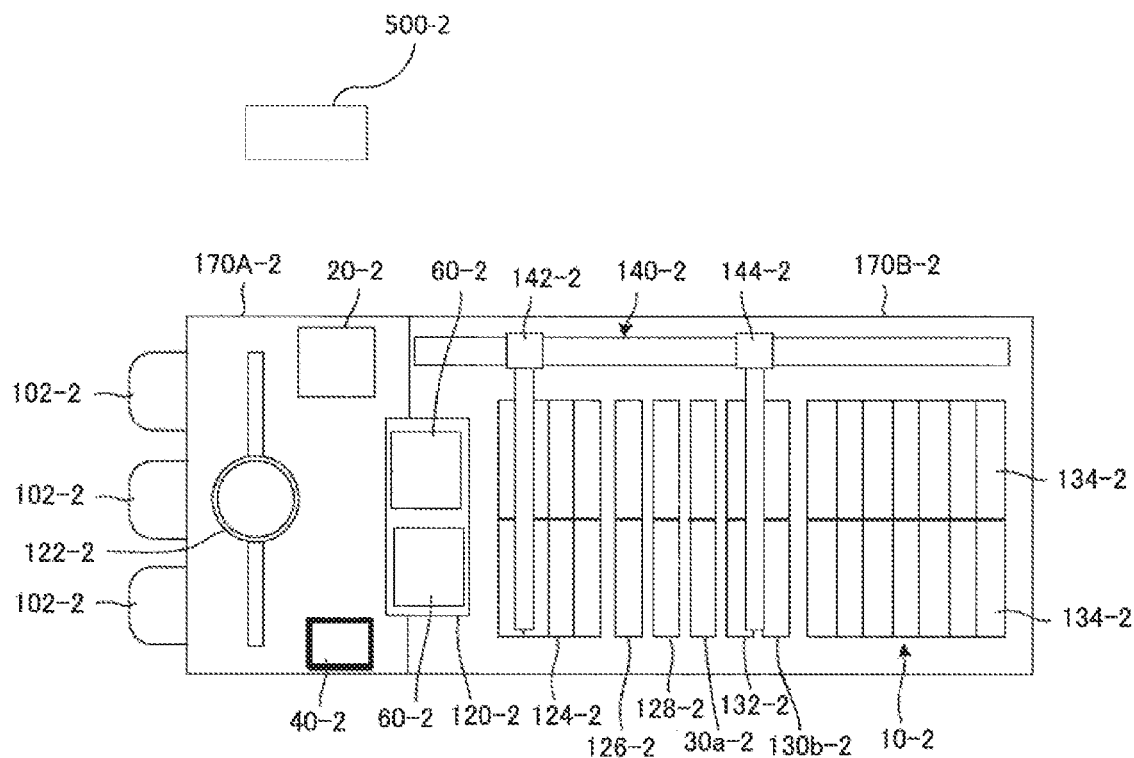
FIG. 19 is a general layout diagram of a plating device according to one embodiment.

FIG. 19 is a general layout diagram of a plating device according to one embodiment. As shown in FIG. 19, this plating device is briefly divided into: a load/unload portion 170A-2 that loads a substrate into a substrate holder 60-2 or unload the substrate from the substrate holder 60-2; and a treatment portion 170B-2 that processes the substrate.

The load/unload portion 170A-2 is provided with three FOUPs (Front-Opening Unified Pods) 102-2, an aligner 40-2 that aligns positions of an orientation flat, a notch, or the like of the substrate with a predetermined direction, and a spin rinse drier 20-2 that dries the substrate after plating treatment by rotating the substrate at a high speed. The FOUP 102-2 houses a plurality of substrates such as semiconductor wafers on multiple stages. In the vicinity of the spin rinse drier 20-2, a fixing unit 120-2 is provided where the substrate holder 60-2 is placed to set or remove the substrate. At the center of these units 102-2, 40-2, 20-2, 120-2, a substrate carrier device 122-2, made up of a carrier robot for carrying the substrate between the units, is disposed.

The fixing unit 120-2 is configured such that two substrate holders 60-2 are placeable thereon. In the fixing unit 120-2, a substrate is passed or received between one substrate holder 60-2 and the substrate carrier device 122-2, and thereafter a substrate is passed or received between the other substrate holder 60-2 and the substrate carrier device 122-2.

The treatment portion 170B-2 of the plating device includes a stocker 124-2, a pre-wetting tank 126-2, a pre-soaking tank 128-2, a first cleaning tank 130a-2, a blow tank 132-2, a second cleaning tank 130b-2, and a plating tank 10-2. In the stocker 124-2, the substrate holder 60-2 is stored or temporarily stored. In the pre-wetting tank 126-2, the substrate is immersed into pure water. In the pre-soaking tank 128-2, an oxide film on the surface of a conductive layer such as a seed layer, which is formed on the surface of the substrate, is etched and removed. In the first cleaning tank 130a-2, the pre-soaked substrate is cleaned by a cleaning solution (pure water, etc.) along with the substrate holder 60-2. In the blow tank 132-2, the cleaned substrate is drained. In the second cleaning tank 130b-2, the plated substrate is cleaned by the cleaning solution along with the substrate holder 60-2. The stocker 124-2, the pre-wetting tank 126-2, the pre-soaking tank 128-2, the first cleaning tank 130a-2, the blow tank 132-2, the second cleaning tank 130b-2, and the plating tank 10-2 are disposed in this order.

The plating tank 10-2 has a plurality of plating cells 134-2 including an overflow tank, for example. In each plating cell 134-2, one substrate is housed inside and the substrate is immersed into a plating solution held inside. A voltage is applied between the substrate and an anode in the plating cell 134-2, to thereby perform plating, such as copper plating, on the substrate surface.

The plating device includes a substrate holder carrier device 140-2 that is located lateral to the above instruments, carries the substrate holder 60-2 with the substrate among these instruments, and has adopted a linear motor system, for example. This substrate holder carrier device 140-2 includes a first transporter 142-2 and a second transporter 144-2. The first transporter 142-2 is configured so as to carry the substrate among the fixing unit 120-2, the stocker 124-2, the pre-wetting tank 126-2, the pre-soaking tank 128-2, the first cleaning tank 130a-2, and the blow tank 132-2. The second transporter 144-2 is configured so as to carry the substrate among the first cleaning tank 130a-2, the second cleaning tank 130b-2, the blow tank 132-2, and the plating tank 10-2. In another embodiment, the plating device may include only any one of the first transporter 142-2 and the second transporter 144-2, and any one of the transporters may carry the substrate among, the fixing unit 120-2, the stocker 124-2, the pre-wetting tank 126-2, the pre-soaking tank 128-2, the first cleaning tank 130a-2, the second cleaning tank 130b-2, the blow tank 132-2, and the plating tank 10-2.

Figure 20:
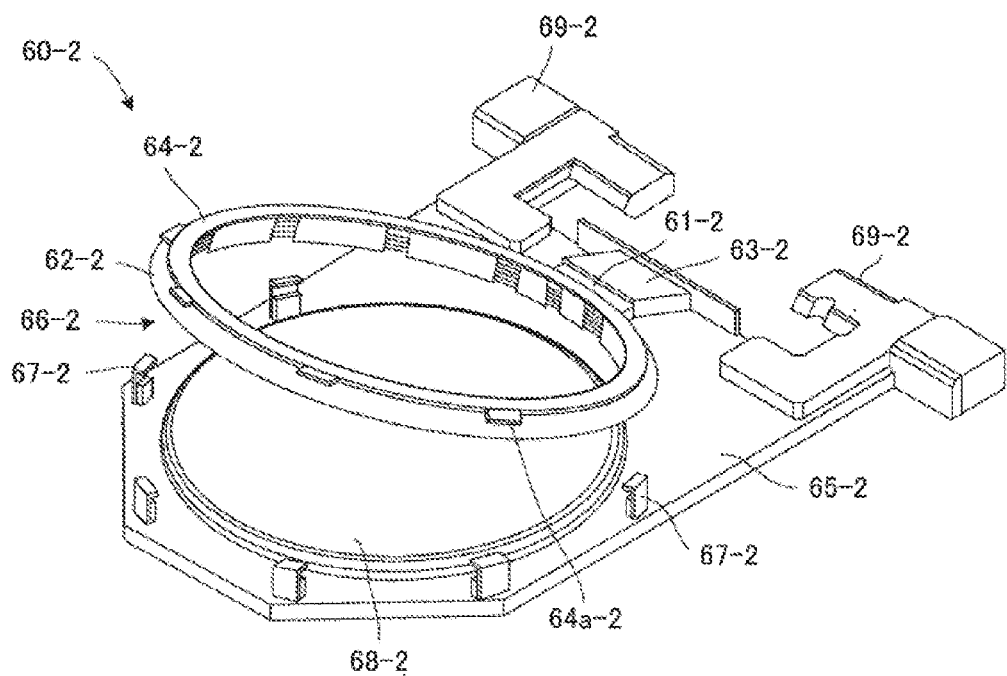
FIG. 20 is a perspective view of a substrate holder used in the plating device shown in FIG. 19.

FIG. 20 is a perspective view of the substrate holder 60-2 that is used in the plating device shown in FIG. 19. As shown in FIG. 20, the substrate holder 60-2 includes a first holding member 65-2 made of vinyl chloride, for example, and having a rectangular flat shape, and a second holding member 66-2 fitted openably/closably to this first holding member 65-2 via a hinge 63-2. A holding surface 68-2 for holding the substrate is provided in the substantially center of the first holding member 65-2 of the substrate holder 60-2. Outside the holding surface 68-2 of the first holding member 65-2, reversed L-shaped dampers 67-2 each having a protrusion that protrudes inward are provided at regular intervals along the circumference of the holding surface 68-2.

A pair of substantially T-shaped hands 69-2, which serves as a support portion at the time of carrying, or supporting by suspension, the substrate holder 60-2, is coupled to the edge of the first holding member 65-2 of the substrate holder 60-2. In the stocker 124-2 shown in FIG. 19, the hands 69-2 are hung on the upper surface of the peripheral wall of the stocker 124-2, so that the substrate holder 60-2 is vertically supported by suspension. The hands 69-2 of the substrate holder 60-2 supported by suspension are held by the first transporter 142-2 or the second transporter 144-2, to carry the substrate holder 60-2. Also in the pre-wetting tank 126-2, the pre-soaking tank 128-2, the cleaning tanks 130a-2, 130b-2, the blow tank 132-2, and the plating tank 10-2, the substrate holder 60-2 is supported by suspension on the respective peripheral walls thereof via the hands 69-2.

Further, an external contact, which is not shown and configured to be connected to an external power source portion, is provided on the hand 69-2. This external contact is electrically connected to a plurality of conductors 73-2 (cf. FIG. 21) provided on the outer circumference of the holding surface 68-2 via a plurality of wires.

The second holding member 66-2 includes a base portion 61-2 fixed to the hinge 63-2, and a ring-like seal holder 62-2 fixed to the base portion 61-2. A press ring 64-2 for pressing and fixing the seal holder 62-2 to the first holding member 65-2 is rotatably mounted in the seal holder 62-2 of the second holding member 66-2. The press ring 64-2 has a plurality of externally protruding projections 64a-2 on the outer circumference. The upper surface of the projection 64a-2 and the lower surface of the inward protrusion of the damper 67-2 have taper surfaces inclined in directions opposite to each other along the rotational direction.

At the time of holding the substrate, the substrate is first placed on the holding surface 68-2 of the first holding member 65-2, with the second holding member 66-2 in an open state, and the second holding member 66-2 is then closed. Subsequently, the press ring 64-2 is rotated clockwise to slip the projection 64a-2 of the press ring 64-2 into the inside (the lower side) of the inward protrusion of the damper 67-2. This makes the first holding member 65-2 and the second holding member 66-2 fastened to each other and locked via the taper surfaces provided respectively on the press ring 64-2 and the dampers 67-2, to hold the substrate. At the time of canceling the hold of the substrate, the press ring 64-2 is rotated counterclockwise, with the first holding member 65-2 and the second holding member 66-2 in the locked state. This makes the projection 64a-2 of the press ring 64-2 removed from the reversed L-shaped dampers 67-2 to cancel the hold of the substrate.

Figure 21:
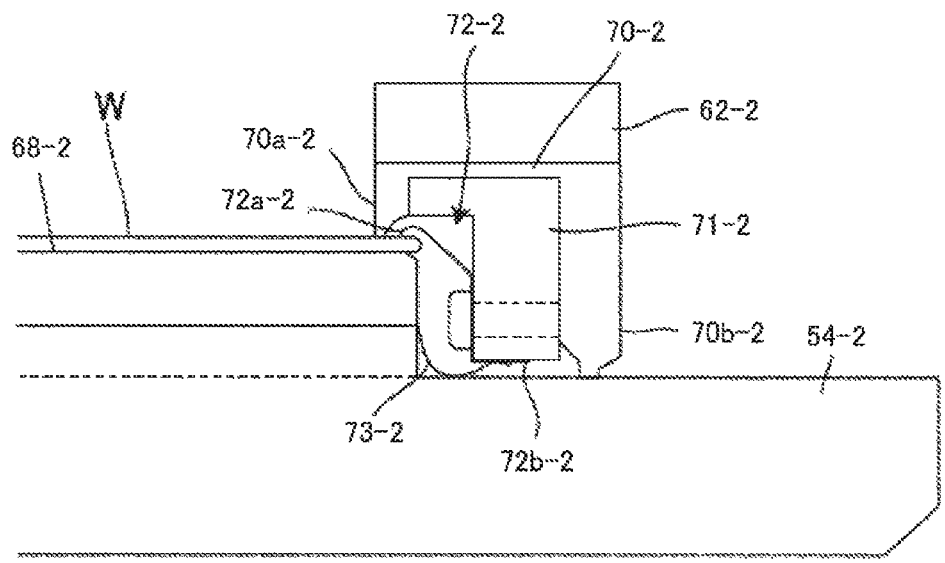
FIG. 21 is a sectional view showing an electric contact of the substrate holder shown in FIG. 20.

FIG. 21 is a sectional view showing the electric contact of the substrate holder 60-2 shown in FIG. 20. As shown in FIG. 21, the substrate W is placed on the holding surface 68-2 of the first holding member 65-2. A plurality of conductor 73-2 (one conductor 73-2 in the figure), connected to a plurality of wires extending from the external contact provided on the hand 69-2 shown in FIG. 20, are disposed between the holding surface 68-2 and the first holding member 65-2. When the substrate W is placed on the holding surface 68-2 of the first holding member 65-2, the plurality of conductors 73-2 are disposed outside the circumference of the substrate W such that the edges of the conductors 73-2 are exposed lateral to the substrate W in a state where the conductors 73-2 have spring properties on the surface of the first holding member 65-2.

A seal member 70-2, which is pressure-welded to the outer circumference of the surface of the substrate W and the first holding member 65-2 when the substrate W is held in the substrate holder 60-2, is fitted to the surface (the lower surface in the figure) of the seal holder 62-2 which faces the first holding member 65-2. The seal member 70-2 has a lip portion 70a-2 for sealing the surface of the substrate W and a lip portion 70b-2 for sealing the surface of the first holding member 65-2.

A support 71-2 is fitted to an interior portion sandwiched between the pair of lip portions 70a-2 and 70b-2 of the seal member 70-2. A plurality of electric contacts 72-2, configured such that the electricity is feedable thereto from the conductors 73-2, are fixed to the support 71-2 by using screws, for example, to be disposed along the circumference of the substrate W. The electric contact 72-2 has the electric contact end 72a-2 extending toward the inside of the holding surface 68-2 and a leg 72b-2 configured such that the electricity is feedable thereto from the conductor 73-2.

When the first holding member 65-2 and the second holding member 66-2 shown in FIG. 20 are locked, as shown in FIG. 21, the shorter lip portion 70a-2 on the inner circumference side of the seal member 70-2 is pressed to the surface of the substrate W, and the longer lip portion 70b-2 on the outer circumference side of the seal member 70-2 is pressed to the surface of the first holding member 65-2. Accordingly, the space between the lip portion 70a-2 and the lip portion 70b-2 is reliably sealed and the substrate W is held.

In the region sealed by the seal member 70-2, namely the region sandwiched between the pair of lip portions 70a-2 and 70b-2 of the seal member 70-2, the conductor 73-2 is electrically connected to the leg 72b-2 of the electric contact 72-2, and the electric contact end 72a-2 is in contact with the seed layer on the edge portion of the substrate W. Hence the electricity can be fed to the substrate W via the electric contact 72-2 in a state where the substrate W is held in the substrate holder 60-2 while sealed by the seal member 70-2.

As described above, a resist pattern is previously formed on the substrate W on which the seed layer has been formed. Before the substrate W is carried to the plating device shown in FIG. 19, the substrate surface is irradiated with UV or the like to remove a resist residual thereon (ashing treatment), and hydrophilic treatment (descum treatment) is performed on the resist surface. The substrate W subjected to the ashing treatment and the descum treatment is then carried to the plating device and held into the substrate holder 60-2. At this time, an oxide film may be formed on, or an organic matter volatilized from the resist may adhere to, the seed layer on the edge portion with no resist of the substrate W applied thereto with the lapse of time from the ashing treatment and the descum treatment. The electric contact 72-2 comes into contact with the edge portion of the substrate W as shown in FIG. 21. and thus when an oxide film is formed on, or an organic matter adheres to, the seed layer on the edge portion of the substrate W, a variation occurs in contact resistance among the plurality of electric contacts 72-2 of the substrate holder 60-2, which may cause deterioration in uniformity of the plated film thickness.

Figure 22:
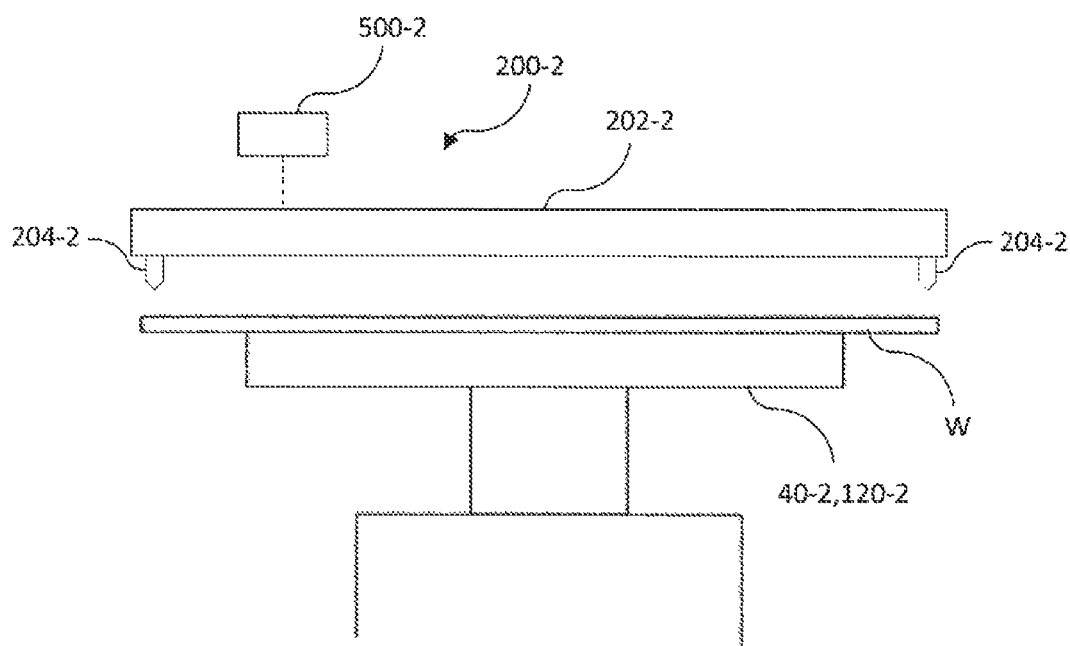
FIG. 22 is a side view schematically showing a resistance measuring instrument according to one embodiment.
Figure 23:
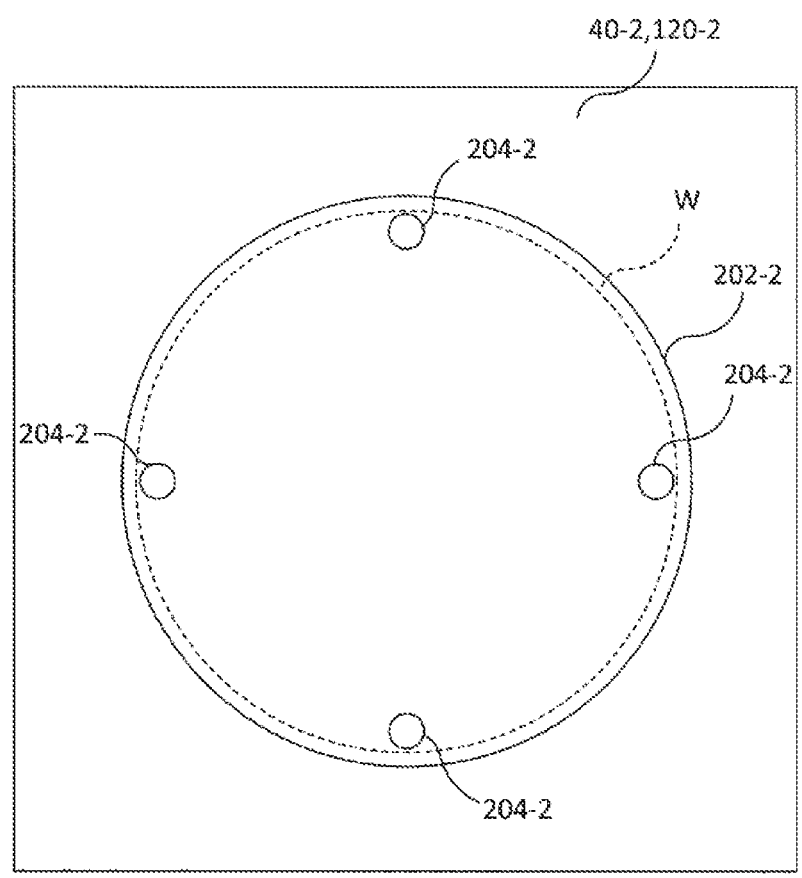
FIG. 23 is a top view schematically showing the resistance measuring instrument shown in FIG. 22.

In one embodiment, the plating device includes a resistance measuring instrument 200-2 for measuring the electric resistance of the seed layer on the edge portion of the substrate W. Note that in the present specification, the edge portion of the substrate W means a region with which the electric contact 72-2 can come into contact, or a region that is closer to the circumferential edge side of the substrate W than the portion with which the seal member 70-2 come into contact when the substrate W is held by the substrate holder 60-2. For example, in the present embodiment, the edge portion of the substrate W means a region closer to the outer circumference than the portion with which the lip portion 70a-2 of the seal member 70-2 shown in FIG. 21 comes into contact, the region being within about 5 mm, preferably about 2 mm, from the outer circumferential edge of the substrate W toward the substrate center. FIG. 22 is a side view schematically showing a resistance measuring instrument 200-2 according to one embodiment. FIG. 23 is a top view schematically showing the resistance measuring instrument 200-2 shown in FIG. 22. In one embodiment, the resistance measuring instrument 200-2 can be disposed in the aligner 40-2 or the fixing unit 120-2. Alternatively, the resistance measuring instrument 200-2 may be provided in a dedicated resistance measuring station in the plating device. The resistance measuring instrument 200-2 includes a resistance measuring head 202-2. The resistance measuring head 202-2 can be a disk-like structure having a diameter almost the same as, or larger than, the diameter of the substrate W being a measuring object. The resistance measuring head 202-2 is configured so as to be movable by a movement mechanism, not shown, in the vertical direction to the plane of the substrate W. Alternatively, as one embodiment, the resistance measuring head 202-2 may be configured so as to be rotatable around the central axis of the resistance measuring head 202-2 and the central axis of the substrate W.

As shown in FIGS. 22, 23, the resistance measuring instrument 200-2 includes contact pins 204-2 disposed on the lower surface of the resistance measuring head 202-2, namely the surface facing the substrate W. The contact pin 204-2 is disposed on the resistance measuring head 202-2 at a position where the contact pin 204-2 comes into contact with the edge portion of the substrate W when the resistance measuring head 202-2 moves in the direction to the substrate W. Although four contact pins 204-2 are shown in the embodiment of FIG. 23, the number of contact pins 204-2 is freely selectable, and at least one contact pin 204-2 is provided on the resistance measuring head 202-2. In one embodiment, the contact pin 204-2 can be provided with a probe that achieves the resistance measurement by a four probe method.

In one embodiment, the resistance measuring instrument 200-2 can measure the resistance at a plurality of spots on the edge portion of the substrate W. When the resistance measuring instrument 200-2 is disposed in the aligner 40-2, with the aligner 40-2 including a rotation mechanism, the resistance can be measured at each of the plurality of spots on the edge portion of the substrate W by rotating the substrate W disposed on the aligner 40-2 and bringing the contact pins 204-2 into contact with the plurality of spots. When a plurality of contact pins 204-2 are provided, the plurality of contact pins 204-2 may be simultaneously brought into contact with different spots on the substrate W to simultaneously measure the resistance of the plurality of spots on the substrate V. When the resistance measuring instrument 200-2 is disposed in the aligner 40-2, the rotation mechanism may not be provided in the resistance measuring head 202-2. When the resistance measuring instrument 200-2 is provided in the fixing unit 120-2, it is possible to measure the resistance at the plurality of spots on the substrate W by rotating the resistance measuring head 202-2 as appropriate. When a plurality of contact pins 204-2 are provided, the plurality of contact pins 204-2 may be simultaneously brought into contact with different spots on the substrate W to simultaneously measure the resistance of the plurality of spots on the substrate W. When the plurality of contact pins 204-2 are provided, the rotation mechanism of the resistance measuring head 202-2 may not be provided.

Figure 24:
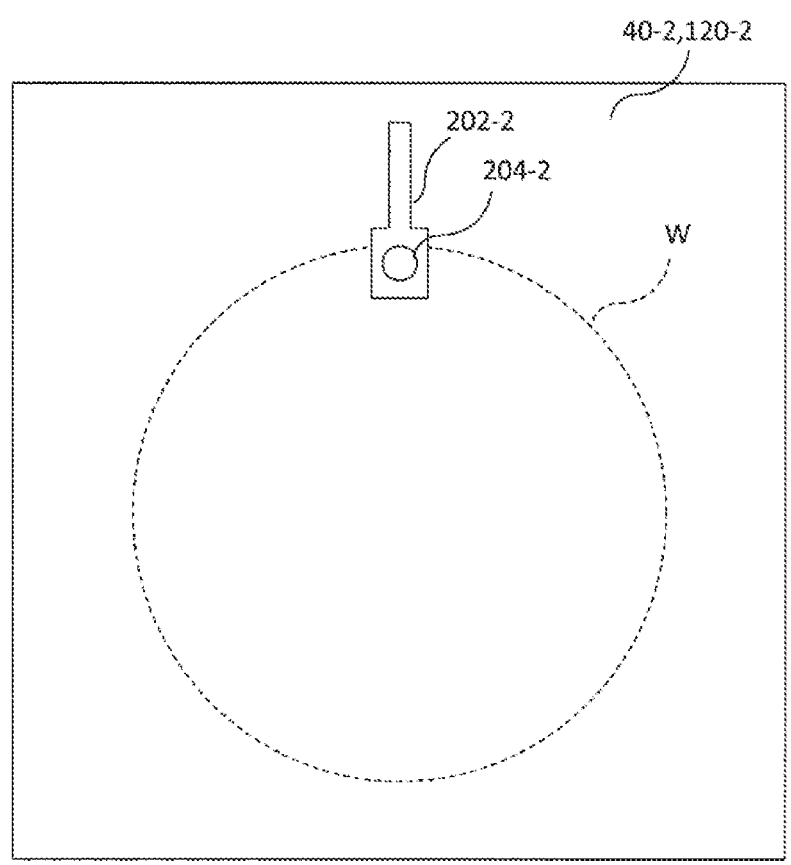
FIG. 24 is a top view schematically showing a resistance measuring instrument according to one embodiment.

FIG. 24 is a top view schematically showing a resistance measuring instrument 200-2 according to one embodiment. In the embodiment of FIG. 24, the resistance measuring head 202-2 includes one contact pin 204-2. The resistance measuring head 202-2 in the embodiment of FIG. 24 is movable by a movement mechanism, not shown, in the radial direction or the circumferential direction of the substrate W, and is also movable in the vertical direction to the plane of the substrate W. When the resistance measuring instrument 200-2 is disposed in the aligner 40-2, it is possible to measure the resistance of each of a plurality of edge portions of the substrate W by the aligner 40-2 rotating the substrate W.

Figure 32A:
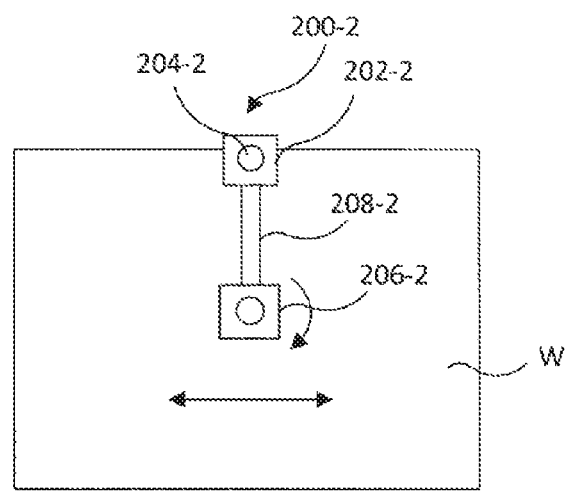
FIG. 32A is a top view schematically showing a resistance measuring instrument according to one embodiment.
Figure 32B:
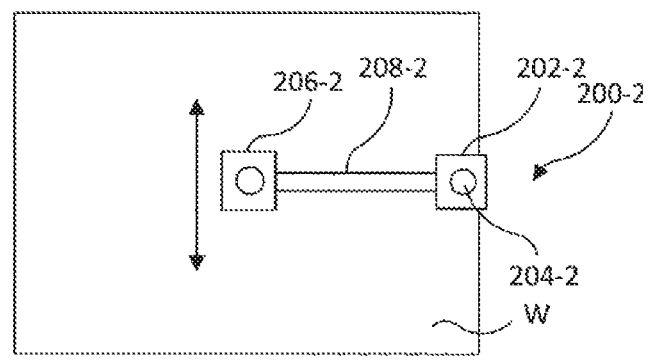
FIG. 32B is a top view schematically showing the resistance measuring instrument according to one embodiment.
Figure 32C:
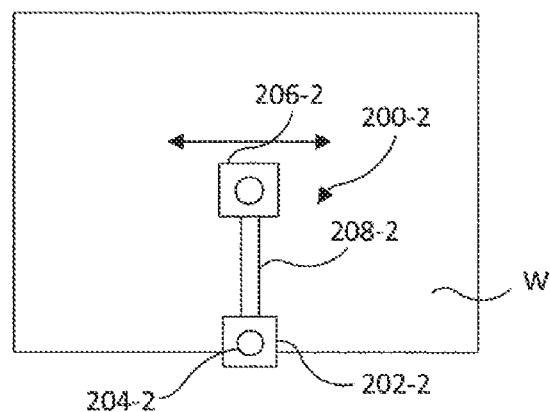
FIG. 32C is a top view schematically showing the resistance measuring instrument according to one embodiment.
Figure 32D:
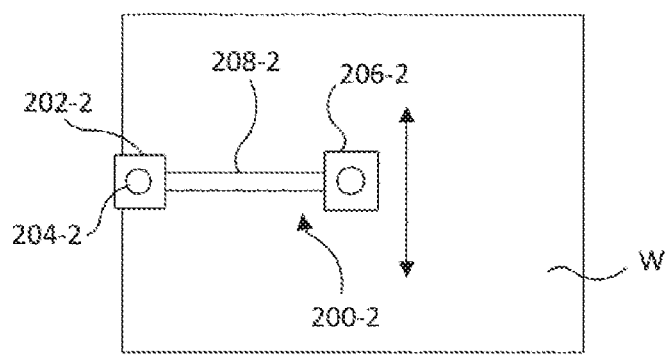
FIG. 32D is a top view schematically showing the resistance measuring instrument according to one embodiment.
Figure 33:
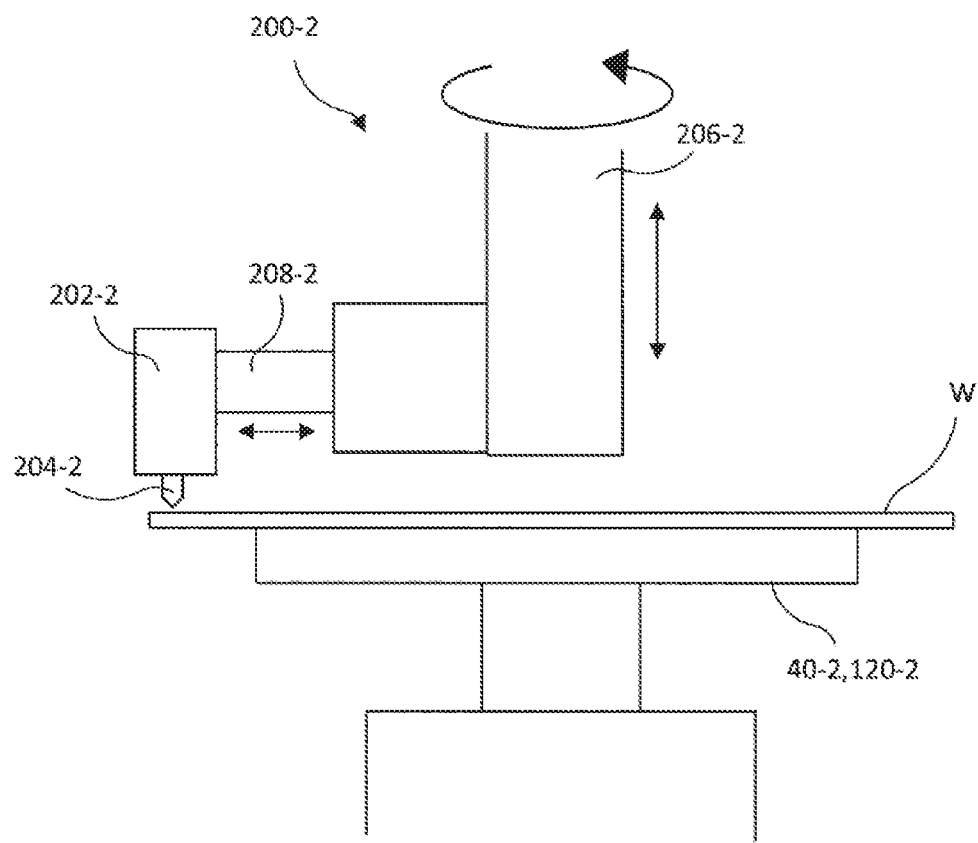
FIG. 33 is a schematic side view of the resistance measuring instrument of FIGS. 32A to FIG. 32D.

FIGS. 32A to 32D are top views schematically showing a resistance measuring instrument 200-2 according to one embodiment. In the embodiment of FIGS. 32A to 32D, the substrate W is a rectangular substrate as well as a substrate having a substantially rectangular parallelepiped shape. In FIGS. 32A to 32D, for the sake of clarifying the figures, only the substrate W and the resistance measuring instrument 200-2 are shown and the other configurations are omitted. FIG. 33 is a schematic side view of the resistance measuring instrument 200-2 of FIGS. 32A to FIG. 32D. As shown in FIG. 33, the resistance measuring instrument 200-2 includes a supporting shaft member 206-2. The supporting shaft member 206-2 is configured so as to be rotatable by the motor or the like. The supporting shaft member 206-2 is configured so as to be linearly movable in two orthogonal directions parallel to the surface of the substrate W (in the perpendicular and lateral directions in FIGS. 32A to 32D). Further, the supporting shaft member 206-2 is configured so as to be movable in the vertical direction to the surface of the substrate W (in the perpendicular direction in FIG. 33). An extension member 208-2 extends from the supporting shaft member 206-2 in the parallel direction to the surface of the substrate W. The extension member 208-2 is configured so as to be extendable in the parallel direction to the surface of the substrate W. A resistance measuring head 202-2 is fitted to the extension member 208-2. A contact pin 204-2 is fitted to the resistance measuring head 202-2. The contact pin 204-2 can be provided with a probe that achieves resistance measurement by the four probe method, for example. The contact pin 204-2 is brought into contact with the edge portion of the substrate W, and it is thereby possible to measure the electric resistance of the edge portion of the substrate W.

For measuring the electric resistance of the edge portion of the substrate W, the resistance measuring head 202-2 is moved to a position where the contact pin 204-2 comes into contact with the edge portion of the substrate W. In the state shown in FIG. 32A, the supporting shaft member 206-2 can move along the direction of the edge portion of the substrate W. It is thus possible to measure the electric resistance at an arbitrary spot on one edge portion of the substrate W. In the state shown in FIG. 32A, when the electric resistance of one edge portion of the substrate W is measured, the supporting shaft member 206-2 is rotated by 90 degrees and the length of the extension member 208-2 is changed as appropriate, whereby it is possible to position the contact pin 204-2 on the next edge portion as shown in FIG. 32B. In the state shown in FIG. 32B, the supporting shaft member 206-2 is moved along the edge portion of the substrate W, whereby it is possible to measure the electric resistance at an arbitrary spot on the edge portion of the substrate W. Further, the electric resistance of the next edge portion of the substrate W can be measured by further rotating the supporting shaft member 206-2 by 90 degrees (FIG. 32C), and the electric resistance of the next edge portion of the substrate W can be measured by further rotating the supporting shaft member 206-2 by 90 degrees (FIG. 32D). As thus described, the resistance measuring instrument 200-2 according to the embodiment shown in FIGS. 32A to 32D and FIG. 33 can measure the electric resistance of the edge portion of the rectangular substrate. Such a resistance measuring instrument 200-2 can be disposed in the aligner 40-2 or the fixing unit 120-2. Alternatively, the resistance measuring instrument 200-2 may be provided in a dedicated resistance measuring station in the plating device. The resistance measuring instrument 200-2 according to the embodiment shown in FIGS. 32A to 32D and FIG. 33 is provided with the movement mechanism, and hence a mechanism for moving the substrate W may not be provided.

Figure 34A:
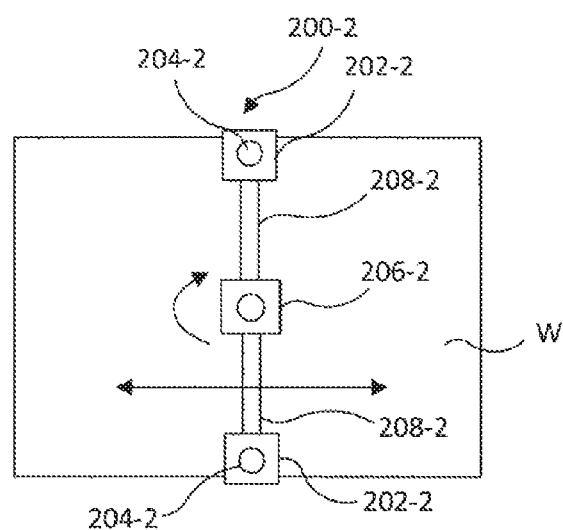
FIG. 34A is a top view schematically showing a resistance measuring instrument according to one embodiment.
Figure 34B:
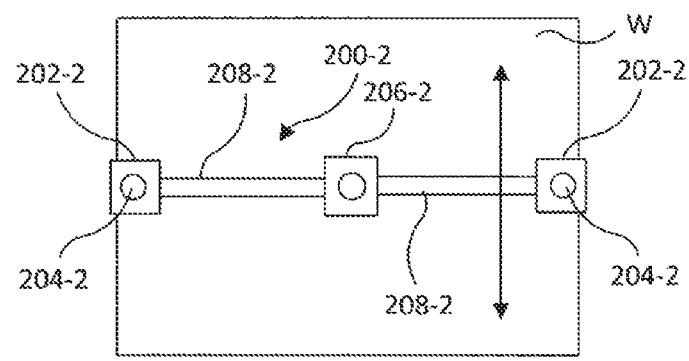
FIG. 34B is a top view schematically showing the resistance measuring instrument according to one embodiment.
Figure 35:
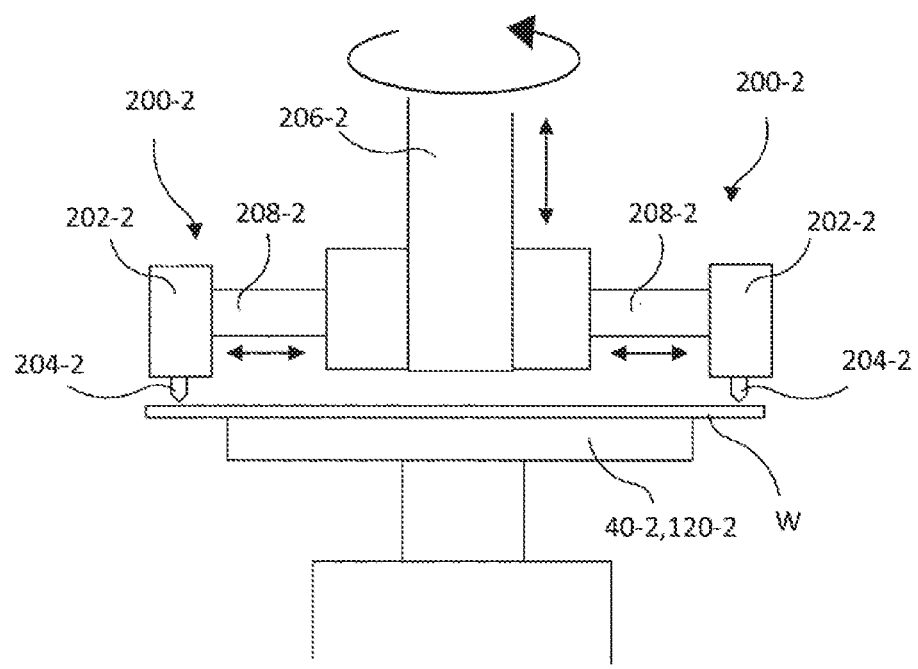
FIG. 35 is a schematic side view of the resistance measuring instrument of FIGS. 34A and 34B.

FIGS. 34A and 34B are top views schematically showing a resistance measuring instrument 200-2 according to one embodiment. In the embodiment of FIGS. 34A and 34B, the substrate W is a rectangular substrate as well as a substrate having a substantially rectangular parallelepiped shape. In FIGS. 34A and 34B, for the sake of clarifying the figures, only the substrate W and the resistance measuring instrument 200-2 are shown and the other configurations are omitted. FIG. 35 is a schematic side view of the resistance measuring instrument 200-2 of FIGS. 34A and 34B. As shown in FIG. 35, the resistance measuring instrument 200-2 includes a supporting shaft member 206-2. The supporting shaft member 206-2 is configured so as to be rotatable by the motor or the like. The supporting shaft member 206-2 is configured so as to be linearly movable in two orthogonal directions parallel to the surface of the substrate W (in the perpendicular and lateral directions in FIGS. 34A and 34B). Further, the supporting shaft member 206-2 is configured so as to be movable in the vertical direction to the surface of the substrate W (in the perpendicular direction in FIG. 35). Two extension members 208-2 extend oppositely from the supporting shaft member 206-2 in the parallel direction to the surface of the substrate W. Each extension member 208-2 is configured so as to be extendable in the parallel direction to the surface of the substrate W. A resistance measuring head 202-2 is fitted to each extension member 208-2. A contact pin 204-2 is fitted to the resistance measuring head 202-2. The contact pin 204-2 can be provided with a probe that achieves resistance measurement by the four probe method, for example. The contact pin 204-2 is brought into contact with the edge portion of the substrate W, and it is thereby possible to measure the electric resistance of the edge portion of the substrate W.

For measuring the electric resistance of the edge portion of the substrate W, the resistance measuring head 202-2 is moved to a position where each contact pin 204-2 comes into contact with the edge portion of the substrate W. In the state shown in FIG. 34A, the supporting shaft member 206-2 can move along the direction of the edge portion of the substrate W. It is thus possible to simultaneously measure the electric resistance at an arbitrary spot on each of two edge portions of the substrate W. In the state shown in FIG. 34A, when the electric resistance of each of the two edge portions of the substrate W is measured, the supporting shaft member 206-2 is rotated by 90 degrees and the length of the extension member 208-2 is changed as appropriate, whereby it is possible to position the contact pin 204-2 on the next edge portion as shown in FIG. 34B. In the state shown in FIG. 34B, the supporting shaft member 206-2 is moved along the edge portion of the substrate W, whereby it is possible to measure the electric resistance at an arbitrary spot on the edge portion of the substrate W. As thus described, the resistance measuring instrument 200-2 according to the embodiment shown in FIGS. 34A and 34B and FIG. 35 includes the two resistance measuring heads 202-2 and can thus simultaneously measure the electric resistance of each of two edge portions of the rectangular substrate. Such a resistance measuring instrument 200-2 can be disposed in the aligner 40-2 or the fixing unit 120-2. Alternatively, the resistance measuring instrument 200-2 may be provided in a dedicated resistance measuring station in the plating device. The resistance measuring instrument 200-2 according to the embodiment shown in FIGS. 34A and 34B and FIG. 35 is provided with the movement mechanism, and hence a mechanism for moving the substrate W may not be provided.

Figure 36A:
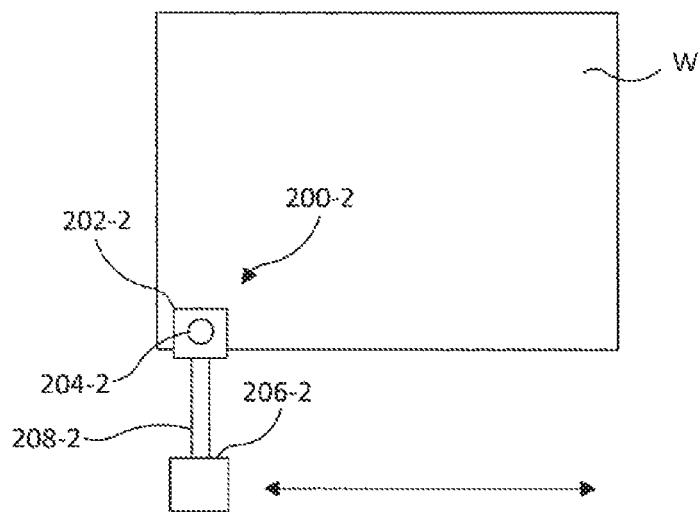
FIG. 36A is a top view schematically showing a resistance measuring instrument according to one embodiment.
Figure 36B:
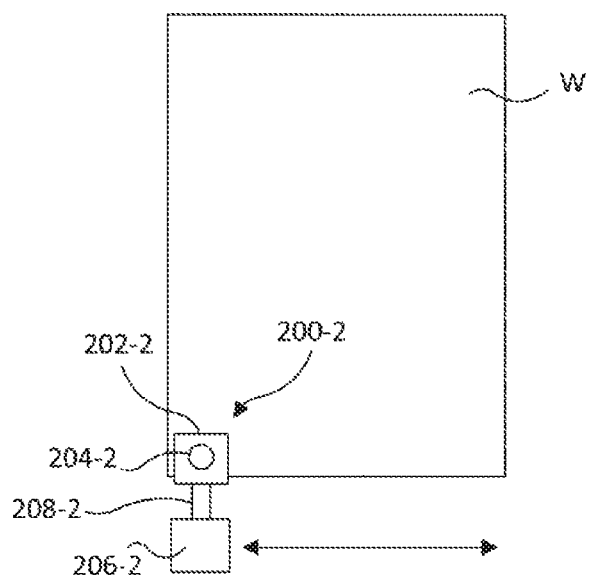
FIG. 36B is a top view schematically showing the resistance measuring instrument according to one embodiment.
Figure 36C:
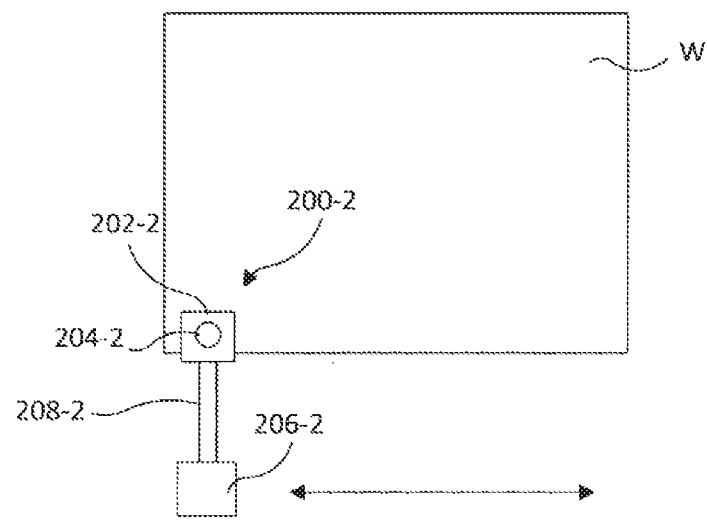
FIG. 36C is a top view schematically showing the resistance measuring instrument according to one embodiment.
Figure 36D:
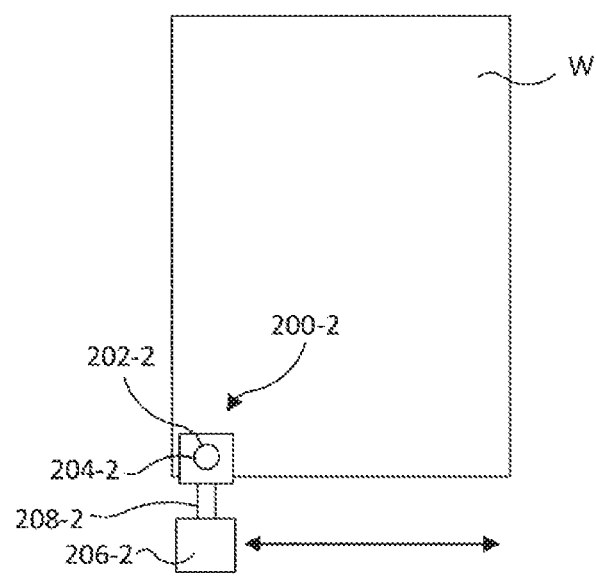
FIG. 36D is a top view schematically showing the resistance measuring instrument according to one embodiment.
Figure 37:
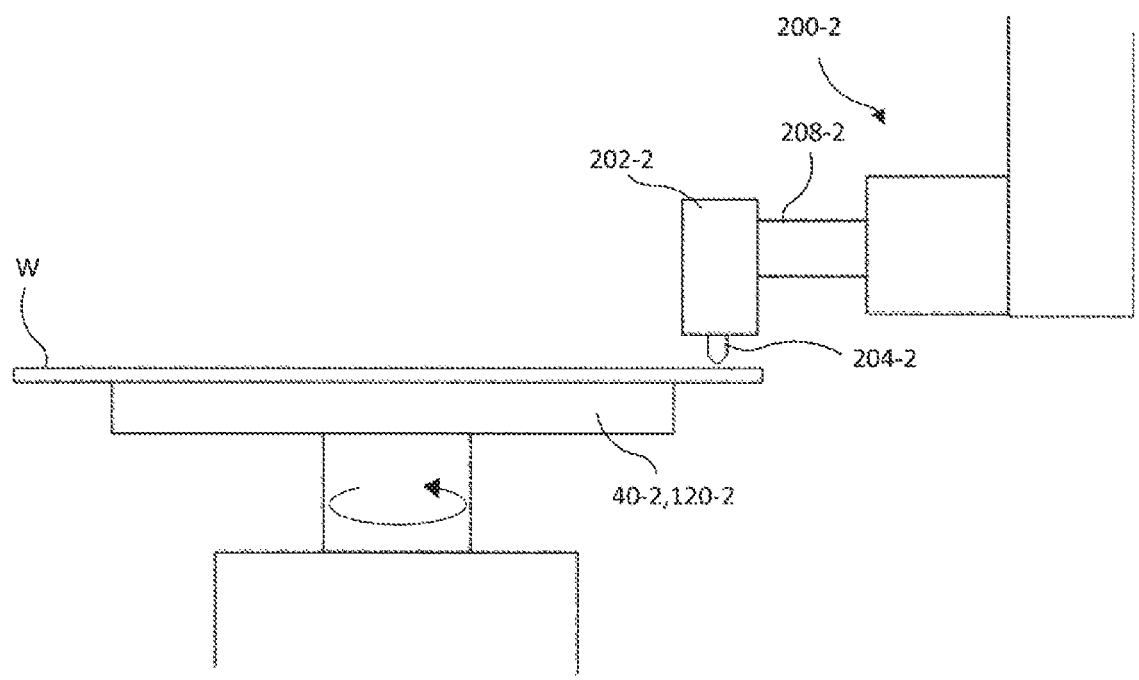
FIG. 37 is a schematic side view of the resistance measuring instrument of FIGS. 36A to 36D.

FIGS. 36A to 36D are top views schematically showing a resistance measuring instrument 200-2 according to one embodiment. In the embodiment of FIGS. 36A to 36D, the substrate W is a rectangular substrate as well as a substrate having a substantially rectangular parallelepiped shape. In FIGS. 36A to 36D, for the sake of clarifying the figures, only the substrate W and the resistance measuring instrument 200-2 are shown and the other configurations are omitted. FIG. 37 is a schematic side view of the resistance measuring instrument 200-2 of FIGS. 36A to 36D. As shown in FIG. 37, the resistance measuring instrument 200-2 includes a supporting shaft member 206-2. The supporting shaft member 206-2 is configured so as to be linearly movable in the parallel direction to the surface of the substrate W (in the lateral directions in FIGS. 36A to 36D). Further, the supporting shaft member 206-2 is configured so as to be movable in the vertical direction to the surface of the substrate W (in the perpendicular direction in FIG. 37). An extension member 208-2 extends from the supporting shaft member 206-2 in the parallel direction to the surface of the substrate W. The extension member 208-2 is configured so as to be extendable in the parallel direction to the surface of the substrate W. A resistance measuring head 202-2 is fitted to the extension member 208-2. A contact pin 204-2 is fitted to the resistance measuring head 202-2. The contact pin 204-2 can be provided with a probe that achieves resistance measurement by the four probe method, for example. The contact pin 204-2 is brought into contact with the edge portion of the substrate W, and it is thereby possible to measure the electric resistance of the edge portion of the substrate W. In the embodiment shown in FIG. 37, the rotation mechanism is provided in the mechanism for holding the substrate W (e.g., the aligner 40-2, the fixing unit 120-2, etc.), and the substrate W can be rotated.

For measuring the electric resistance of the edge portion of the substrate W, the extension member 208-2 is adjusted in length to reach a position where the contact pin 204-2 comes into contact with the edge portion of the substrate W. In the state shown in FIG. 36A, the supporting shaft member 206-2 can move along the edge portion of the substrate W. It is thus possible to measure the electric resistance at an arbitrary spot on one edge portion of the substrate W. In the state shown in FIG. 36A, when the electric resistance of one edge portion of the substrate W is measured, the substrate W is rotated by 90 degrees and the length of the extension member 208-2 is changed as appropriate, whereby it is possible to position the contact pin 204-2 on the next edge portion as shown in FIG. 36B. In the state shown in FIG. 36B, the supporting shaft member 206-2 is moved along the edge portion of the substrate W, whereby it is possible to measure the electric resistance at an arbitrary spot on the edge portion of the substrate W. Further, the electric resistance of the next edge portion of the substrate W can be measured by further rotating the substrate W by 90 degrees (FIG. 36C), and the electric resistance of the next edge portion of the substrate W can be measured by further rotating the substrate W by 90 degrees (FIG. 36D). As thus described, the resistance measuring instrument 200-2 according to the embodiment shown in FIGS. 36A to 36D and FIG. 37 can measure the electric resistance of the edge portion of the rectangular substrate. Such a resistance measuring instrument 200-2 can be disposed in the aligner 40-2 or the fixing unit 120-2. Alternatively, the resistance measuring instrument 200-2 may be provided in a dedicated resistance measuring station in the plating device. In the embodiment shown in FIGS. 36A to 36D and FIG. 37, the rotation mechanism is provided on the substrate W side, and hence the rotation mechanism may not be provided in the resistance measuring instrument 200-2.

Figure 38A:
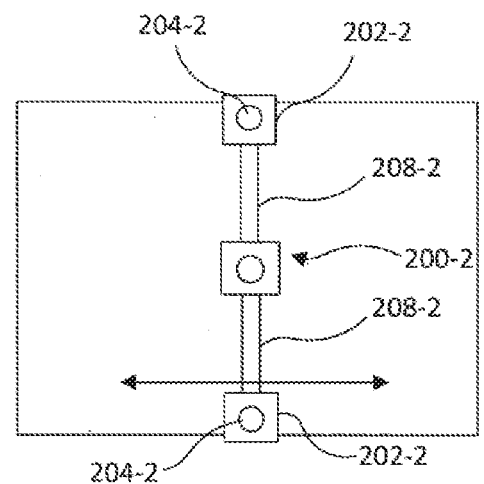
FIG. 38A is a top view schematically showing a resistance measuring instrument according to one embodiment.
Figure 38B:
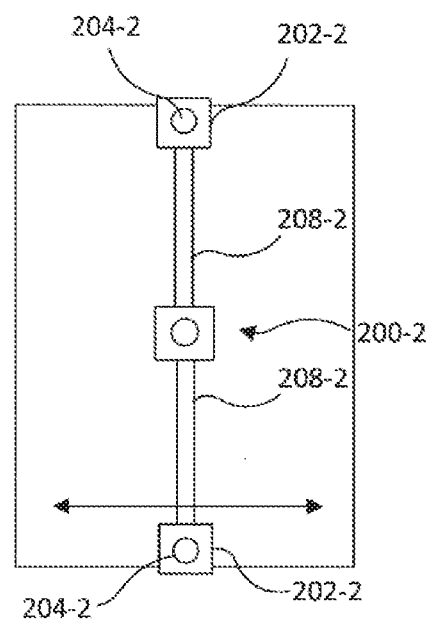
FIG. 38B is a top view schematically showing the resistance measuring instrument according to one embodiment.
Figure 39:
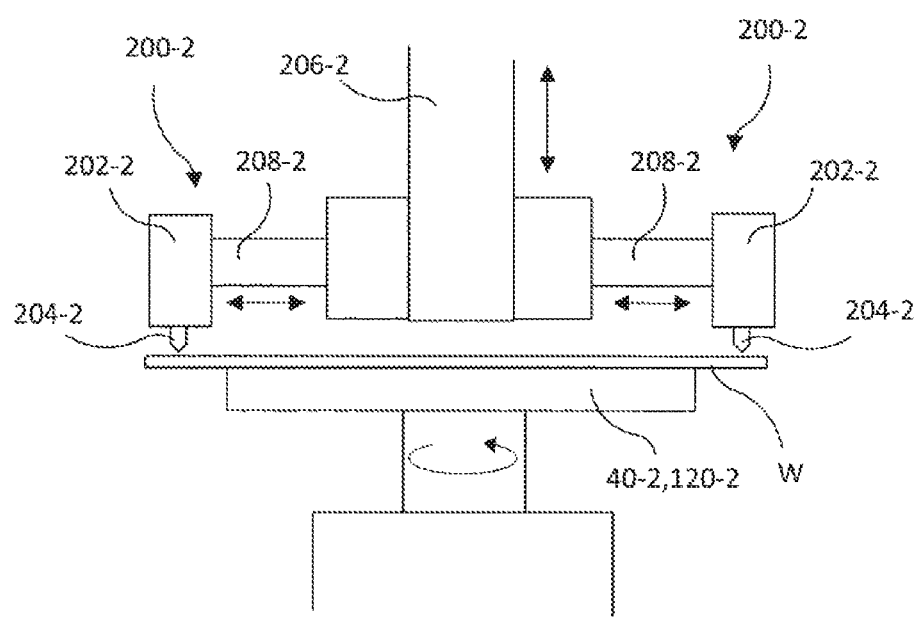
FIG. 39 is a schematic side view of the resistance measuring instrument of FIGS. 38A and 38B.

FIGS. 38A and 38B are top views schematically showing a resistance measuring instrument 200-2 according to one embodiment. In the embodiment of FIGS. 38A and 38B, the substrate W is a rectangular substrate as well as a substrate having a substantially rectangular parallelepiped shape. In FIGS. 38A and 38B, for the sake of clarifying the figures, only the substrate W and the resistance measuring instrument 200-2 are shown and the other configurations are omitted. FIG. 39 is a schematic side view of the resistance measuring instrument 200-2 of FIGS. 38A and 38B. As shown in FIG. 39, the resistance measuring instrument 200-2 includes a supporting shaft member 206-2. The supporting shaft member 206-2 is configured so as to be linearly movable in the parallel direction to the surface of the substrate W (in the lateral direction in FIGS. 38A and 38B). Further, the supporting shaft member 206-2 is configured so as to be movable in the vertical direction to the surface of the substrate W (in the perpendicular direction in FIG. 39). Two extension members 208-2 extend oppositely from the supporting shaft member 206-2 in the parallel direction to the surface of the substrate W. Each extension member 208-2 is configured so as to be extendable in the parallel direction to the surface of the substrate W. A resistance measuring head 202-2 is fitted to each extension member 208-2. A contact pin 204-2 is fitted to the resistance measuring head 202-2. The contact pin 204-2 can be provided with a probe that achieves resistance measurement by the four probe method, for example. The contact pin 204-2 is brought into contact with the edge portion of the substrate W, and it is thereby possible to measure the electric resistance of the edge portion of the substrate W. in the embodiment shown in FIG. 39, the rotation mechanism is provided in the mechanism for holding the substrate W (e.g., the aligner 40-2, the fixing unit 120-2, etc.), and the substrate W can be rotated.

For measuring the electric resistance of the edge portion of the substrate W, the resistance measuring head 202-2 is moved to a position where each contact pin 204-2 comes into contact with the edge portion of the substrate W. In the state shown in FIG. 38A, the supporting shaft member 206-2 can move along the edge portion of the substrate W. It is thus possible to simultaneously measure the electric resistance at an arbitrary spot on each of two edge portions of the substrate W. In the state shown in FIG. 38A, when the electric resistance of each of two edge portions of the substrate W is measured, the substrate W is rotated by 90 degrees and the length of the extension member 208-2 is changed as appropriate, whereby it is possible to position the contact pin 204-2 on the next edge portion as shown in FIG. 38B. In the state shown FIG. 38B, the supporting shaft member 206-2 is moved along the edge portion of the substrate W, whereby it is possible to measure the electric resistance at an arbitrary spot on the edge portion of the substrate W. As thus described, the resistance measuring instrument 200-2 according to the embodiment shown in FIGS. 38A and 38B and FIG. 39 includes the two resistance measuring heads 202-2 and can thus simultaneously measure the electric resistance of each of the two edge portions of the rectangular substrate. Such a resistance measuring instrument 200-2 can be disposed in the aligner 40-2 or the fixing unit 120-2. Alternatively, the resistance measuring instrument 200-2 may be provided in a dedicated resistance measuring station in the plating device. In the embodiment shown in FIGS. 38A and 38B and FIG. 39, the rotation mechanism is provided on the substrate W side, and hence the rotation mechanism may not be provided in the resistance measuring instrument 200-2.

Figure 25:
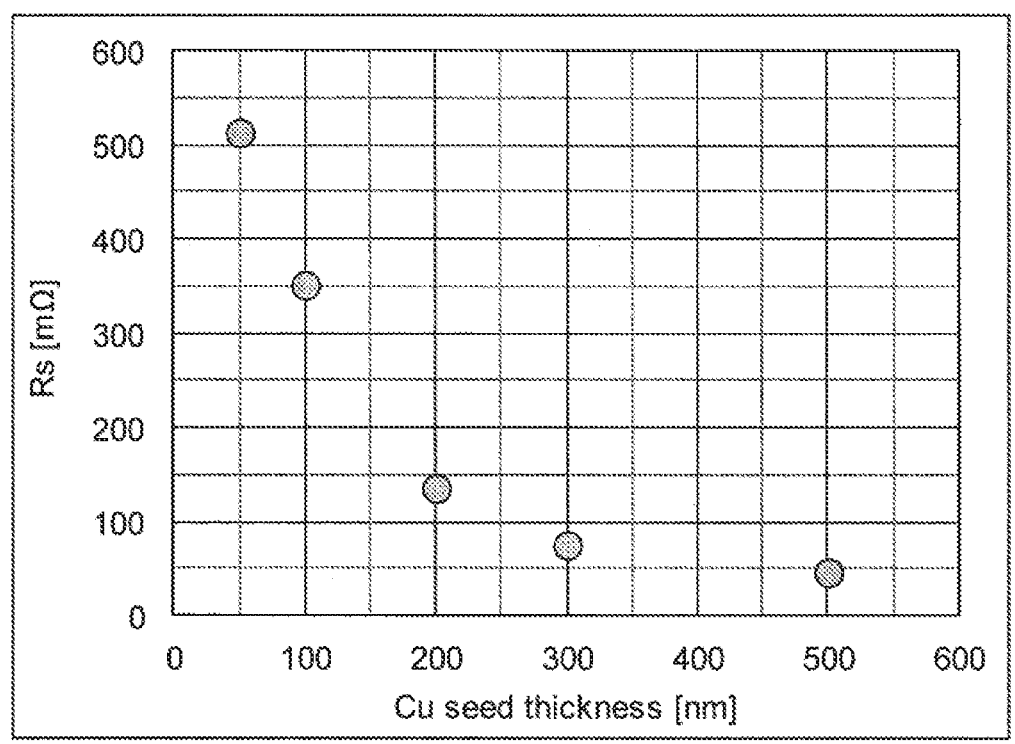
FIG. 25 is a graph showing actual measured values of resistance of substrates using copper with different thicknesses as seed layers, as one example.

The resistance measuring instrument 200-2 is connected to the control device 500-2 (cf. FIGS. 19, 22). The resistance value of the edge portion of the substrate W, measured using the resistance measuring instrument 200-2, is transmitted to the control device 500-2. In the control device 500-2. it is determined whether the transmitted resistance value of the edge portion of the substrate W is within a predetermined range. As one embodiment, the predetermined range can, for example, be a value theoretically calculated from the thickness of the seed layer formed on the substrate W. Alternatively, the predetermined range may be determined from an actual measured value, obtained by previously measuring a resistance value of a standard substrate to be a reference, with a seed layer formed thereon. In this case, the standard substrate may be a plurality of standard substrates with seed layers having different thicknesses. The predetermined range of the resistance value is stored into the control device 500-2. FIG. 25 is a graph showing actual measured values of resistance of substrates using copper with different thicknesses as seed layers, as one example.

In the case of measuring resistance values of a plurality of regions on the edge portion of the substrate W by using the resistance measuring instrument 200-2, when the resistance values of the respective regions are all within the predetermined range, it is possible to determine the substrate as a plating treatable substrate. Further, that variation in the resistance values of the respective regions are within the predetermined range may be taken as a determination reference for the possibility to perform the plating treatment. For example, when a variation among the resistance values of the respective regions is with a range of +15% to −15%, the substrate may be determined as a platable substrate. The variation in resistance value can be determined from a difference between the maximum value and the minimum value, or the maximum divergence from the average value. Further, at the time of measuring the resistance value of the edge portion of the substrate W, the resistance value of the same region may be measured more than once and an average value of the measured values may be taken as the resistance value of the region.

In one embodiment, an edge portion cleaning device 45-2 can be provided in the plating device. As one example, the edge portion cleaning device 45-2 can serve to eliminate (remove) an organic matter formed on the seed layer on the edge portion of the substrate W. As one embodiment, the edge portion cleaning device 45-2 can be provided in the aligner 40-2. Alternatively, a station dedicated for the edge portion cleaning device 45-2 may be provided in the plating device.

Figure 26:
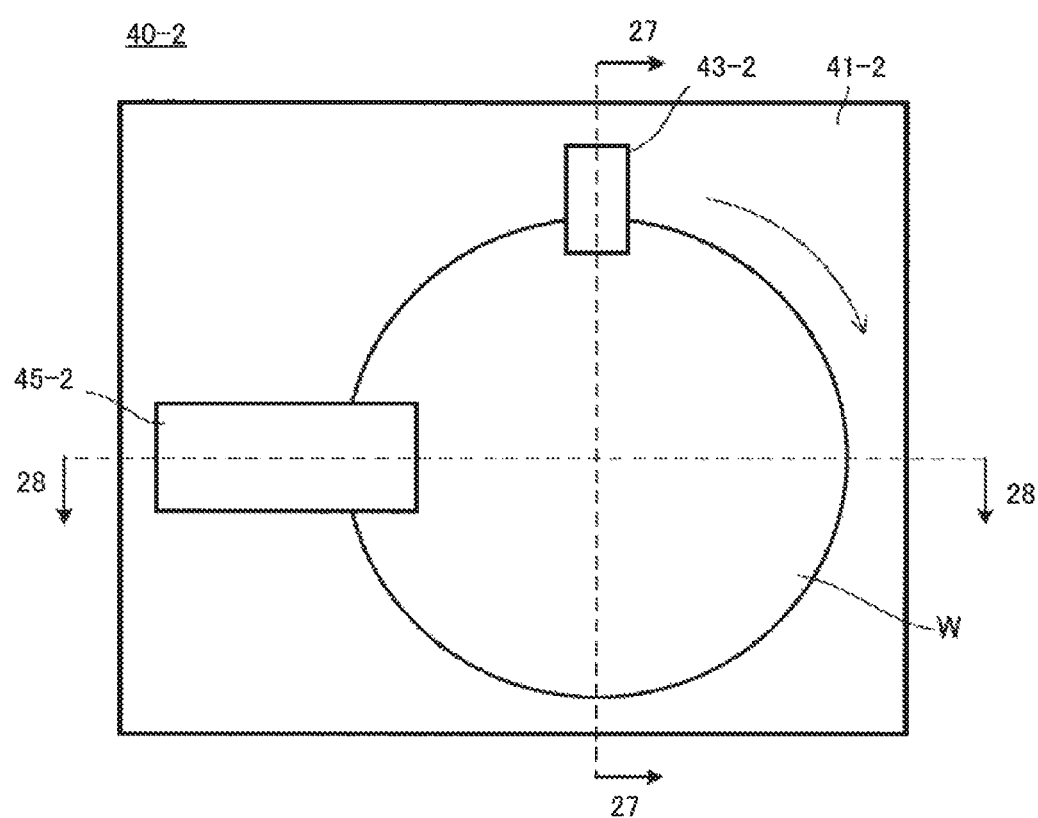
FIG. 26 is a schematic top view showing an aligner that includes an edge portion cleaning device according to one embodiment.
Figure 27:
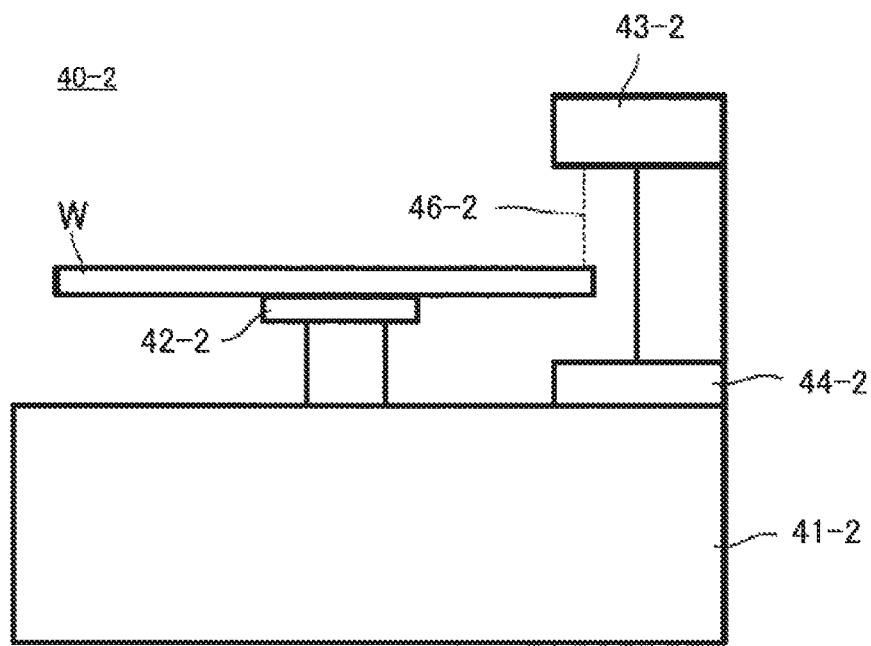
FIG. 27 is a schematic sectional view of the aligner cut along a line of arrows 27-27 shown in FIG. 26.
Figure 28:
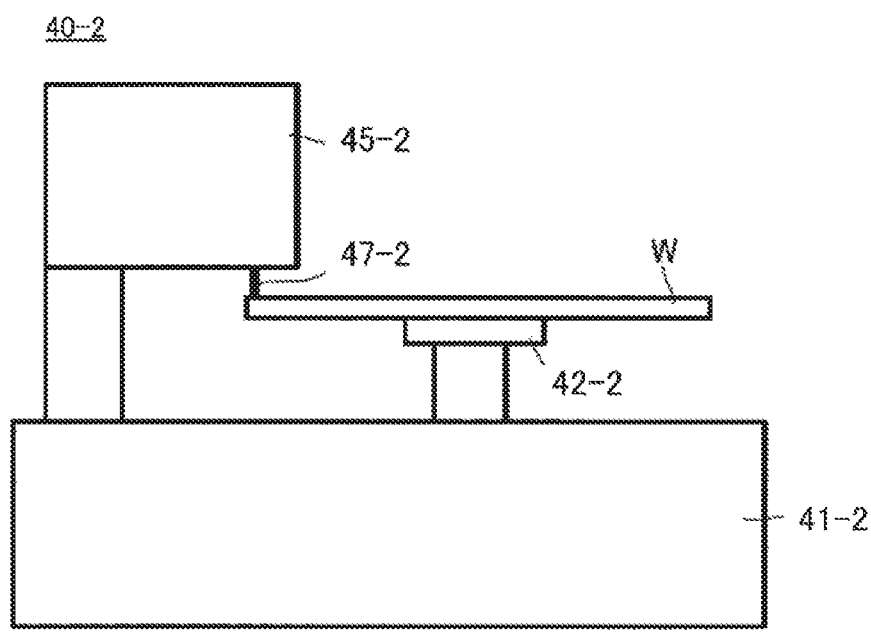
FIG. 28 is a schematic sectional view of the aligner cut along a line of arrows 28-28 shown in FIG. 26.

FIG. 26 is a schematic top view showing the aligner 40-2 that includes the edge portion cleaning device 45-2. FIG. 27 is a schematic sectional view of the aligner 40-2 cut along a line of arrows 27-27 shown in FIG. 26, and FIG. 28 is a schematic sectional view of the aligner 40-2 cut along a line of arrows 28-28 shown in FIG. 26. As shown in FIGS. 26 to 28, the aligner 40-2 includes a base 41-2, a rotation stage 42-2, an aligner light source 43-2, a light detector 44-2, and the edge portion cleaning device 45-2.

The rotation stage 42-2 is configured so as to attract the rear surface of the substrate W and circumferentially rotates the substrate W. Note that the rotation stage 42-2 attracts the substrate W by an electrostatic attraction system or a vacuum sucking system. The aligner light source 43-2 is configured so as to irradiate the vicinity of the edge portion of the substrate W, rotated by the rotation stage 42-2, with light 46-2. When the notch of the substrate W moves to a position irradiated with the light 46-2 from the aligner light source 43-2 by rotation of the substrate W, the light 46-2 passes through the notch and reaches a light detector 44-2. When the light detector 44-2 detects the light 46-2, the aligner 40-2 can recognize that the notch of the substrate W is located immediately below the aligner light source 43-2 and align the orientation of the substrate W.

The edge portion cleaning device 45-2 is a UV irradiation device or a plasma emission device. In the present embodiment, it is configured such that UV or plasma can be locally applied to the edge portion of the substrate W from above the substrate W. The edge portion cleaning device 45-2 can locally apply the UV or plasma to the edge portion of the substrate W before held into the substrate holder 60-2. In other words, the region of the substrate W other than the edge portion is not exposed to the UV or plasma. The rotation stage 42-2 rotates the substrate W, to thereby enable efficient application of the UV or plasma circumferentially through the edge portion of the substrate W. When an organic matter adhering to the edge portion of the substrate W is irradiated with the UV or plasma, the organic matter is decomposed to generate a volatile matter, and the organic matter having become the volatile matter is volatilized and removed. The distance between the substrate W and a UV irradiation source of the LTV irradiation device or a plasma emission hole of the plasma emission device is preferably set to not shorter than about 1 mm and not longer than about 10 mm. When this distance is shorter than 1 mm, there is a potential for the substrate and the UV irradiation source or the plasma emission hole of the plasma emission device to physically come into contact with each other. When this distance is set to exceed 10 mm, the local irradiation with the UV or plasma may not be performed. In order to reliably prevent physical contact between the substrate and the UV irradiation source or the plasma emission hole of the plasma emission device and enable local irradiation, it is more preferable to set this distance to not shorter than about 2 mm and not longer than about 5 mm.

When the edge portion cleaning device 45-2 is the UV irradiation device, as the UV light source, it is possible to adopt, for example, a high pressure mercury lamp, a low pressure mercury lamp, a black light, a laser light source capable of emitting light in the UV area, or the like. Due to the tendency of the high pressure mercury lamp, the low pressure mercury lamp, and the black light to diverge light, when one of these light sources is adopted, it is preferable to install the light source in the vicinity of the substrate W or to irradiate only the edge portion with UV by using an optical system. When the edge portion cleaning device 45-2 is the plasma emission device, for example, an atmospheric remote plasma device or the like can be adopted.

The aligner 40-2 may further include a sensor (spectrophotometer) configured so as to measure an absorbance by irradiating the edge portion of the substrate W with light in an ultraviolet area (from 200 nm to 380 nm) as excitation light, such as light having a wavelength of 365 nm, from above the edge portion and observing the reflected light from the edge portion, or a sensor (fluorescent reflection film thickness meter) for performing irradiation with light in a fluorescent area to monitor the intensity of the reflected light.

This sensor (not shown) may be provided in the edge portion cleaning device 45-2 or may be separately provided in the aligner 40-2. The control device 500-2 of the plating device according to the present embodiment can be configured so as to be able to determine whether or not a contaminant (including an organic matter and an oxide film) on the edge portion has been sufficiently removed based on whether or not the value of the absorbance or the fluorescent intensity measured using this sensor is larger than a previously set threshold. Alternatively, it may be determined whether or not the contaminant on the edge portion has been sufficiently removed by measuring the resistance of the edge portion of the substrate W by using the resistance measuring instrument 200-2 described above. For example, when it is determined that the contaminant on the edge portion has not been sufficiently removed, the edge portion cleaning device 45-2 may repeatedly perform the process of locally irradiating the edge portion of the substrate W with the UV or plasma. When it is determined that the contaminant on the edge portion has been sufficiently removed, the elimination of the organic matter is considered as completed, and the substrate W is carried by the substrate carrier device 122-2 to the fixing unit 120-2, and is subsequently subjected to a series of plating treatment. As thus described, it is determined, before the plating treatment, as to whether or not the contaminant is on the edge portion of the substrate W, and the substrate with no contaminant remaining on the edge portion is subjected to the plating treatment, whereby it is possible to reliably prevent deterioration in in-plane uniformity of the plated film thickness of the substrate W due to a variation in contact resistance of the electric contact provided in the substrate holder 60-2.

The edge portion cleaning device 45-2 can also be configured differently from the embodiment described above. For example, the edge portion cleaning device 45-2 may be configured to feed a chemical solution for removing an oxide film formed on the edge portion of the substrate W while rotating the substrate W. Alternatively, the edge portion cleaning device 45-2 can be configured to bring a sponge or the like into contact with the edge portion of the substrate W while rotating the substrate W, and physically remove a foreign matter, such as an organic matter or an oxide film, formed on the edge portion of the substrate W.

Figure 29:
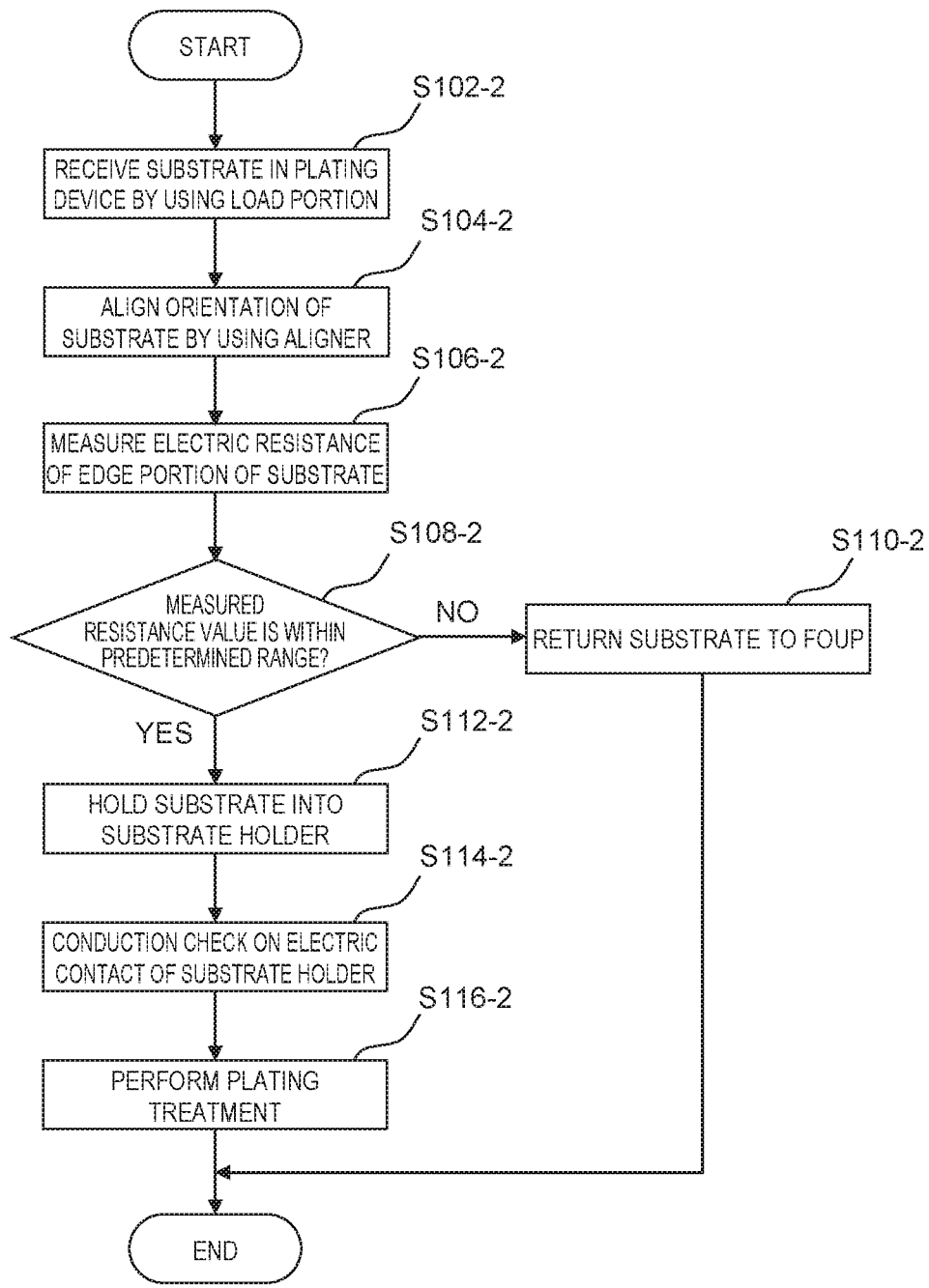
FIG. 29 is a flowchart showing a plating method according one embodiment.

FIG. 29 is a flowchart showing a plating method according one embodiment. As one embodiment, the present plating method can be performed using the plating device described above. First, the substrate W to be subjected to the plating treatment is accepted in the plating device by using the load/unload portion 170A-2 (S102-2). The substrate W is transferred to the aligner 40-2 by the substrate carrier device 122-2, and the orientation of the substrate is aligned with a predetermined direction by the aligner 40-2 (S104-2). Next, the electric resistance of the seed layer on the edge portion of the substrate W is measured (S106-2). The electric resistance can be measured using the resistance measuring instrument 200-2 described above. It is determined whether or not the measured electric resistance is within a predetermined range (S108-2). Such a determination is made by the control device 500-2, for example. When the electric resistance is not within the predetermined range, performing uniform plating is considered impossible, and hence the substrate W is returned to the RAW 102-2. Note that the electric resistance may be measured (S106-2 to S110-2) before the orientation of the substrate is aligned by the aligner 40-2 (S104-2). When the electric resistance is within the predetermined range, the substrate W is held into the substrate holder 60-2 (S112-2). When the substrate W is held into the substrate holder 60-2, a conduction check is performed as to whether or not a current flows from the electric contact of the substrate holder 60-2 to the substrate W (S114-2). Note that the conduction check may be omitted. Thereafter, subsequent plating treatment is performed in a state where the substrate W is held in the substrate holder 60-2 (S116-2).

According to such a plating method, the electric resistance of the seed layer being the electric conduction layer on the edge portion of the substrate W is measured, so that the abnormality of the substrate W can be detected and unnecessary plating treatment can be avoided. In the technique of Japanese Patent Laid-Open No. 2015-200017 described above, it is not possible to determine whether the abnormality of the electric resistance is caused by a factor on the substrate side or a factor on the substrate holder side. However, in the plating method according to the present disclosure, it is possible to detect the abnormality of the electric resistance caused by a factor on the substrate side. Note that the seed layer being the electric conduction layer can be a layer containing a metal that contains at least one of copper (Cu), nickel (Ni), cobalt (Co), ruthenium (Ru), and palladium (Pd).

Figure 30:
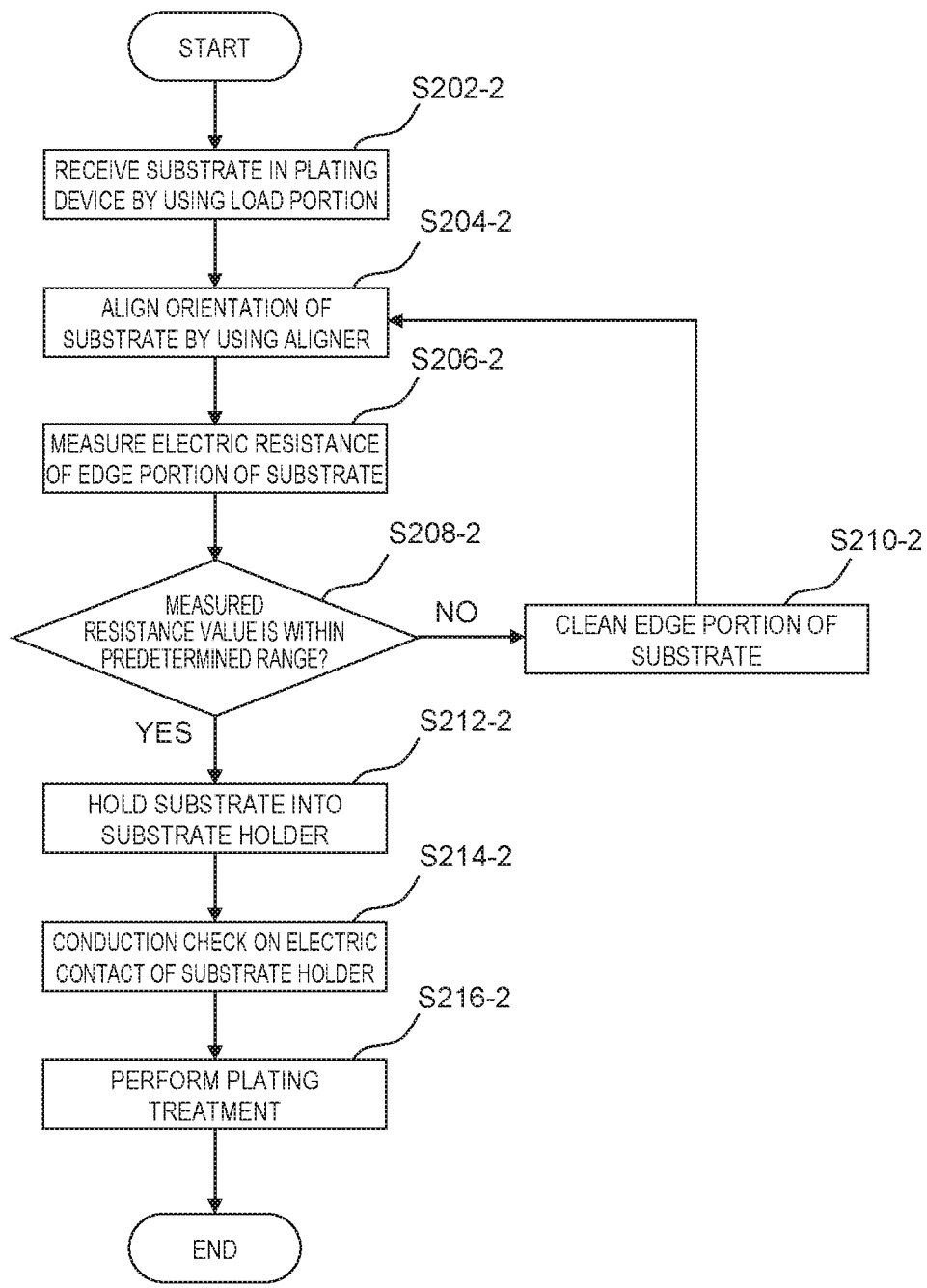
FIG. 30 is a flowchart showing a plating method according one embodiment.
Figure 31:
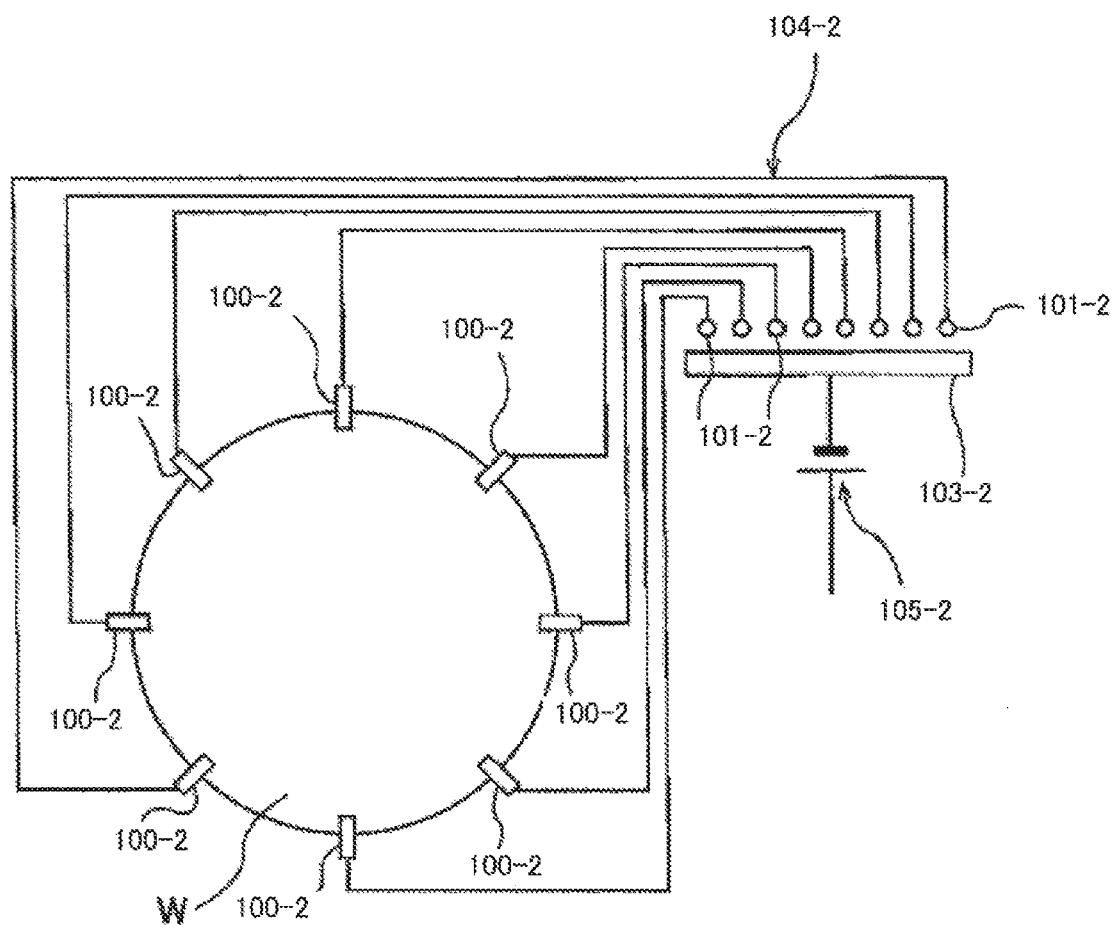
FIG. 31 is a schematic view showing an electric path of the substrate holder.

FIG. 30 is a flowchart showing a plating method according one embodiment. As one embodiment, the present plating method can be performed using the plating device described above. First, the substrate W to be subjected to the plating treatment is accepted in the plating device by using the load/unload portion 1704-2 (S202-2). The substrate W is transferred to the aligner 40-2 by the substrate carrier device 122-2, and the orientation of the substrate is aligned with a predetermined direction by the aligner 40-2 (S204-2). Next, the electric resistance of the seed layer on the edge portion of the substrate W is measured (S206-2). The electric resistance can be measured using the resistance measuring instrument 200-2 described above. It is determined whether or not the measured electric resistance is within a predetermined range (S208-2). Such a determination is made by the control device 500-2, for example. When the electric resistance is not within the predetermined range, there is considered a case where electric conduction layers (seed layers) are not uniformly formed on the surface of the substrate, a case where an unnecessary object, which is produced at the time of application of resist to the substrate, remains on the substrate, a case where the surface of the substrate has been oxidized, or some other case. Hence the edge portion of the substrate W is cleaned (S210-2). The edge portion of the substrate W can be cleaned using, for example, the edge portion cleaning device 45-2 described above. When the portion of the substrate W is cleaned, the orientation of the substrate W is aligned by the aligner 40-2 again (S204-2), to measure the electric resistance of the edge portion of the substrate W and make a determination thereon (S206-2, S208-2). Note that the electric resistance may be measured (S206-2 to S210-2) before the orientation of the substrate is aligned by the aligner 40-2 (S204-2). When the electric resistance is within the predetermined range, the substrate W is held into the substrate holder 60-2 (S212-2). When the substrate W is held into the substrate holder 60-2, a conduction check is performed as to whether or not a current flows from the electric contact of the substrate holder 60-2 to the substrate W (S214-2). Note that the conduction check may be omitted. Thereafter, subsequent plating treatment is performed in a state where the substrate W is held in the substrate holder 60-2 (S216-2). When the electric resistance of the edge portion of the substrate W does not fall within the predetermined range even after the cleaning of the edge portion of the substrate W, the substrate W may be returned to the FOUP 102-2 and the plating treatment may not be performed on that substrate W.

According to such a plating method, when the edge portion of the substrate has abnormality, cleaning the edge portion of the substrate can bring the edge portion of the substrate into an appropriate state, as well as a state where appropriate plating treatment can be performed. Such a handling is possible because abnormality on the substrate side is detectable by measuring the electric resistance of the seed layer that is the electric conduction layer on the edge portion of the substrate W.

As one embodiment, the resistance measuring instrument 200-2 can also be used as a leakage detecting function of the substrate holder 60-2. As described along with FIG. 21, when the substrate W is held into the substrate holder 60-2, the edge portion of the substrate W is separated from the surface to be plated of the substrate W by using the seal member 70-2. Accordingly, in an appropriately sealed state, the plating solution does not come into contact with the edge portion of the substrate W during the plating treatment. However, in an inappropriately sealed case, the plating solution may get into the region of the edge portion of the substrate W during the plating treatment. When the plating solution adheres to the edge portion of the substrate W, it is supposed that the electric resistance of the edge portion of the substrate W increases. Therefore, as described above, it is possible to detect whether or not a leakage has occurred in the substrate holder 60-2 by measuring the electric resistance of the edge portion of the substrate W before the substrate W is held into the substrate holder 60-2, and by measuring the electric resistance of the edge portion of the substrate W after the plating treatment (after S116-2, S216-2). When the electric resistance of the edge portion of the substrate W is larger after the plating treatment than before the plating treatment, a leakage may have occurred in the substrate holder 60-2.

The above plating method and the method for detecting a leakage in the substrate holder may be performed by a computer program. The program may be recorded into a non-transitory recording medium readable by a computer (e.g., control device 500-2). The non-transitory recording medium may be a storage device. The non-transitory recording medium may be a CD-ROM, a DVD-ROM, or the like.

Although the embodiments of the present invention have been described based on some examples, the above embodiments of the present invention are intended to facilitate understanding of the present invention and not to limit the present invention. The present invention can be changed and modified without deviating from its gist, and the present invention naturally includes an equivalent thereto. Further, in a range where at least part of the problem described above can be solved or a range where at least part of the effect is exerted, each of the constituents described in the claims and the specification can be combined in a freely selectable manner or can be omitted.

REFERENCE SIGNS LIST

40 . . . aligner
60 . . . substrate holder
71 . . . external contact
73 . . . electric contacts
75 . . . electric conduction plate
200 . . . resistance measuring module
202 . . . measurement tank
204 . . . holder fixing portion
206 . . . resistance measuring instrument
208 . . . test probe
210 . . . support member
220 . . . shift-over switch
500 . . . control device
45-2 . . . edge portion cleaning device
60-2 . . . substrate holder
120-2 . . . fixing unit
122-2 . . . substrate carrier device
200-2 . . . resistance measuring instrument
202-2 . . . resistance measuring head
204-2 . . . contact pins
500-2 . . . control device
W . . . substrate
WT . . . testing substrate

What is claimed is:

1. A resistance measuring module for measuring electric resistance of a substrate holder, wherein
the substrate holder has an electric contact configured to feed a current to a held substrate and contactable with the substrate,
the substrate holder is able to hold a testing substrate for measurement of electric resistance of the substrate holder, and is configured such that the electric contact comes into contact with the testing substrate in a state where the testing substrate is held, and
the resistance measuring module includes:
a test probe contactable with the testing substrate held in the substrate holder; and
a resistance measuring instrument for measurement of a resistance value between the electric contact and the probe via the testing substrate,
wherein the resistance measuring instrument is configured such that the test probe is contactable with each of a plurality of regions of the testing substrate.

2. The resistance measuring module according to claim 1, wherein the testing substrate has a plurality of electrically insulating regions.

3. The resistance measuring module according to claim 1, wherein the test probe of the resistance measuring instrument is configured so as to be movable in an in-plane direction of the testing substrate.

4. The resistance measuring module according to claim 1, wherein
the resistance measuring instrument includes a support member,
the test probe is attached to the support member, and
the support member is configured so as to be rotatable around a shaft vertical to the plane of the testing substrate.

5. The resistance measuring module according to claim 1, wherein
the resistance measuring instrument includes a plurality of test probes, and
the plurality of test probes are configured so as to be respectively contactable with the plurality of regions of the testing substrate.

6. A substrate holder, comprising:
a substrate support portion for supporting a substrate;
an electric contact, configured to feed a current to the held substrate and contactable with the substrate; and
an electric conduction plate disposed on the substrate support portion, wherein the electric contact and the electric conduction plate are configured so as to be contactable with each other in the state of the substrate holder holding no substrate and configured so as not to be contactable with each other in the state of the substrate holder holding the substrate.

7. The substrate holder according to claim 6, comprising:
a plurality of electric contacts, configured to feed a current to the held substrate and contactable with the substrate; and
a plurality of electric conduction plates disposed on the substrate support portion,
wherein the plurality of electric contacts and the plurality of electric conduction plates are configured so as to be contactable with each other, respectively, in the state of the substrate holder holding no substrate.

8. A plating device, comprising:
a resistance measuring instrument that measures electric resistance of an electric conduction layer on an edge portion of a substrate being a plating object; and
a substrate holder for holding the substrate,
wherein the resistance measuring instrument includes a contact pin configured so as to come into contact with the electric conduction layer on the edge portion of the substrate, the contact pin includes a probe for measuring electric resistance of the edge portion of the substrate by the four probe method, and the resistance measuring instrument is configured so as to measure electric resistance of the edge portion of the substrate before the substrate is held by the substrate holder.

9. The plating device according to claim 8, wherein the resistance measuring instrument is configured so as to measure electric resistance of each of a plurality of spots of the electric conduction layer on the edge portion of the substrate.

10. The plating device according to claim 8, wherein the contact pin is configured so as to be movable in a circumferential direction of the substrate.

11. The plating device according to claim 8, further comprising
an aligner for aligning an orientation of the substrate with a predetermined direction,
wherein the resistance measuring instrument is configured so as to measure electric resistance of the substrate disposed in the aligner.

12. The plating device according to claim 8, further comprising
a fixing unit for fixing the substrate to the substrate holder,
wherein the resistance measuring instrument is configured so as to measure electric resistance of the substrate disposed in the fixing unit.

13. The plating device according to claim 8, further comprising
a control device that receives a resistance value measured using the resistance measuring instrument,
wherein the control device is configured so as to determine a state of the substrate based on the received resistance value.

14. The plating device according to claim 8, further comprising
an edge portion cleaning device for cleaning an edge portion of the substrate.

15. A plating device, comprising:
a first resistance measuring instrument that measures electric resistance of an electric conduction layer on an edge portion of a substrate being a plating object; and
a substrate holder for holding the substrate,
wherein the first resistance measuring instrument includes a contact pin configured so as to come into contact with the electric conduction layer on the edge portion of the substrate, the contact pin includes a probe for measuring electric resistance of the edge portion of the substrate by the four probe method, and the first resistance measuring instrument is configured so as to measure electric resistance of the edge portion of the substrate before the substrate is held by the substrate holder,
the plating device further comprising a holder resistance measuring module for measuring electric resistance of a substrate holder, wherein
the substrate holder has an electric contact configured to feed a current to a held substrate and contactable with the substrate,
the substrate holder is able to hold a testing substrate for measurement of electric resistance of the substrate holder, and is configured such that the electric contact comes into contact with the testing substrate in a state where the testing substrate is held, and
the holder resistance measuring module includes:
a test probe contactable with the testing substrate held in the substrate holder; and
a second resistance measuring instrument for measurement of a resistance value between the electric contact and the probe via the testing substrate.

* * * * *